United States Patent
Shang et al.

(10) Patent No.: US 6,846,115 B1
(45) Date of Patent: Jan. 25, 2005

(54) METHODS, APPARATUS, AND SYSTEMS OF FIBER OPTIC MODULES, ELASTOMERIC CONNECTIONS, AND RETENTION MECHANISMS THEREFOR

(75) Inventors: Alain Shang, Santa Clara, CA (US); Edwin Dair, Los Angeles, CA (US)

(73) Assignee: JDS Uniphase Corporation, San Jose, CA (US)

(*) Notice: Subject to any disclaimer, the term of this patent is extended or adjusted under 35 U.S.C. 154(b) by 247 days.

(21) Appl. No.: 10/059,745

(22) Filed: Jan. 28, 2002

Related U.S. Application Data

(60) Provisional application No. 60/265,181, filed on Jan. 29, 2001.

(51) Int. Cl.[7] .............................. G02B 6/42; H01R 4/58
(52) U.S. Cl. .............................. 385/92; 439/86; 439/91
(58) Field of Search ........................ 385/88–94; 439/86, 439/90, 91, 122, 342; 361/754

(56) References Cited

U.S. PATENT DOCUMENTS

| | | | |
|---|---|---|---|
| 3,795,037 A | * | 3/1974 | Luttmer ........................ 29/883 |
| 4,217,030 A | | 8/1980 | Howarth |
| 4,387,956 A | | 6/1983 | Cline |
| 4,432,604 A | | 2/1984 | Schwab |
| 4,491,981 A | | 1/1985 | Weller et al. |
| 4,699,455 A | | 10/1987 | Erbe et al. |
| 4,756,593 A | | 7/1988 | Koakutsu et al. |
| 4,861,134 A | | 8/1989 | Alameel et al. |
| 5,013,247 A | | 5/1991 | Watson |
| 5,039,194 A | | 8/1991 | Block et al. |
| 5,104,243 A | | 4/1992 | Harding |
| 5,117,476 A | | 5/1992 | Yingst et al. |
| 5,163,109 A | | 11/1992 | Okugawa et al. |
| 5,253,320 A | | 10/1993 | Takahashi et al. |
| 5,289,345 A | | 2/1994 | Corradetti et al. |
| 5,321,583 A | | 6/1994 | McMahon |

(List continued on next page.)

FOREIGN PATENT DOCUMENTS

| | | |
|---|---|---|
| GB | 2297007 | 7/1996 |
| JP | 07225327 | 8/1995 |
| JP | 07225328 | 8/1995 |
| WO | WO-9512227 | 5/1995 |

OTHER PUBLICATIONS

Sasaki, Shinichi, et al., "A Compact Optical Active Connector: An Optical Interconnect Module with an Electrical Connector Interface", *IEEE Transactions on Advanced Packaging*, vol. 22, No. 4, (Nov. 1999), 541–550.

Yamanaka, Naoaki, "Optoelectronic Packaging", *Communication System Interconnection Structure (Chapter 2)*, (Apr. 18, 1997), 11–43.

*Primary Examiner*—Akm Enayet Ullah
*Assistant Examiner*—Sarah Song
(74) *Attorney, Agent, or Firm*—Allen Dyer Dopplet Milbrath & Gilchrist, P.A.

(57) ABSTRACT

Fiber optic modules, retention mechanisms, cages or receptacles and their electrical connections. An conductive elastomer is used to provide an electrical connection between contacts of a fiber optic module and contacts of a host printed circuit board or between contacts of a fiber optic module and contacts of an electrical connector. Hot-pluggable electrical connections for fiber optic modules are also described including parallel data connections for small form factor fiber optic modules.

17 Claims, 34 Drawing Sheets

U.S. PATENT DOCUMENTS

| | | | |
|---|---|---|---|
| 5,325,455 A | 6/1994 | Henson et al. | |
| 5,329,428 A | 7/1994 | Block et al. | |
| D353,796 S | 12/1994 | Oliver et al. | |
| D354,271 S | 1/1995 | Speiser et al. | |
| 5,412,497 A | 5/1995 | Kaetsu et al. | |
| 5,442,726 A | 8/1995 | Howard et al. | |
| 5,546,281 A | 8/1996 | Poplawski et al. | |
| 5,561,727 A | 10/1996 | Akita et al. | |
| 5,596,663 A | 1/1997 | Ishibashi et al. | |
| 5,717,533 A | 2/1998 | Poplawski et al. | |
| 5,734,558 A | 3/1998 | Poplawski et al. | |
| 5,738,538 A | 4/1998 | Bruch et al. | |
| 5,757,998 A | 5/1998 | Thatcher et al. | |
| 5,767,999 A * | 6/1998 | Kayner | 398/164 |
| 5,810,607 A | 9/1998 | Shih et al. | |
| 5,833,471 A | 11/1998 | Selna | |
| 5,834,335 A | 11/1998 | Buschbom | |
| 5,864,468 A | 1/1999 | Poplawski et al. | |
| 5,879,173 A | 3/1999 | Poplawski et al. | |
| 5,883,783 A | 3/1999 | Turturro | |
| 5,889,652 A | 3/1999 | Turturro | |
| 5,901,263 A | 5/1999 | Gaio et al. | |
| 5,905,638 A | 5/1999 | MacDonald, Jr. et al. | |
| 5,947,751 A | 9/1999 | Massingill | |
| 5,966,487 A | 10/1999 | Gilliland et al. | |
| 5,980,324 A * | 11/1999 | Berg et al. | 439/630 |
| 5,991,161 A | 11/1999 | Samaras et al. | |
| 6,046,597 A | 4/2000 | Barabi | |
| 6,047,172 A | 4/2000 | Babineau et al. | |
| 6,062,873 A | 5/2000 | Kato | |
| 6,062,893 A | 5/2000 | Miskin et al. | |
| 6,074,228 A | 6/2000 | Berg et al. | |
| 6,078,500 A | 6/2000 | Beaman et al. | |
| 6,085,006 A | 7/2000 | Gaio et al. | |
| RE36,820 E | 8/2000 | McGinley et al. | |
| 6,142,802 A | 11/2000 | Berg | |
| 6,149,465 A | 11/2000 | Berg et al. | |
| 6,178,096 B1 | 1/2001 | Flickinger et al. | |
| 6,179,627 B1 | 1/2001 | Daly et al. | |
| 6,200,041 B1 | 3/2001 | Gaio et al. | |
| 6,201,704 B1 | 3/2001 | Poplawski et al. | |
| 6,203,333 B1 | 3/2001 | Medina et al. | |
| 6,220,873 B1 | 4/2001 | Samela et al. | |
| 6,220,878 B1 | 4/2001 | Poplawski et al. | |
| 6,241,534 B1 | 6/2001 | Neer et al. | |
| 6,267,606 B1 | 7/2001 | Poplawski et al. | |
| 6,335,869 B1 | 1/2002 | Branch et al. | |
| 6,350,063 B1 | 2/2002 | Gilliland et al. | |
| 6,392,887 B1 | 5/2002 | Day et al. | |
| 6,430,053 B1 | 8/2002 | Peterson et al. | |
| 6,439,918 B1 | 8/2002 | Togami et al. | |
| 6,485,322 B1 | 11/2002 | Branch et al. | |
| 6,494,623 B1 | 12/2002 | Ahrens et al. | |
| 6,517,382 B2 | 2/2003 | Flickinger et al. | |
| 6,519,160 B1 | 2/2003 | Branch et al. | |
| 6,524,134 B2 | 2/2003 | Flickinger et al. | |
| 6,530,785 B1 | 3/2003 | Hwang | |
| 6,532,155 B2 | 3/2003 | Green et al. | |
| 6,533,470 B2 | 3/2003 | Ahrens | |
| 6,533,603 B1 * | 3/2003 | Togami | 439/372 |
| 6,556,445 B2 | 4/2003 | Medina | |
| 6,570,768 B2 | 5/2003 | Medina | |
| 2002/0093796 A1 | 7/2002 | Medina | |
| 2002/0150343 A1 | 10/2002 | Chiu et al. | |
| 2002/0167793 A1 | 11/2002 | Branch et al. | |
| 2003/0091301 A1 * | 5/2003 | Lee et al. | 385/89 |

* cited by examiner

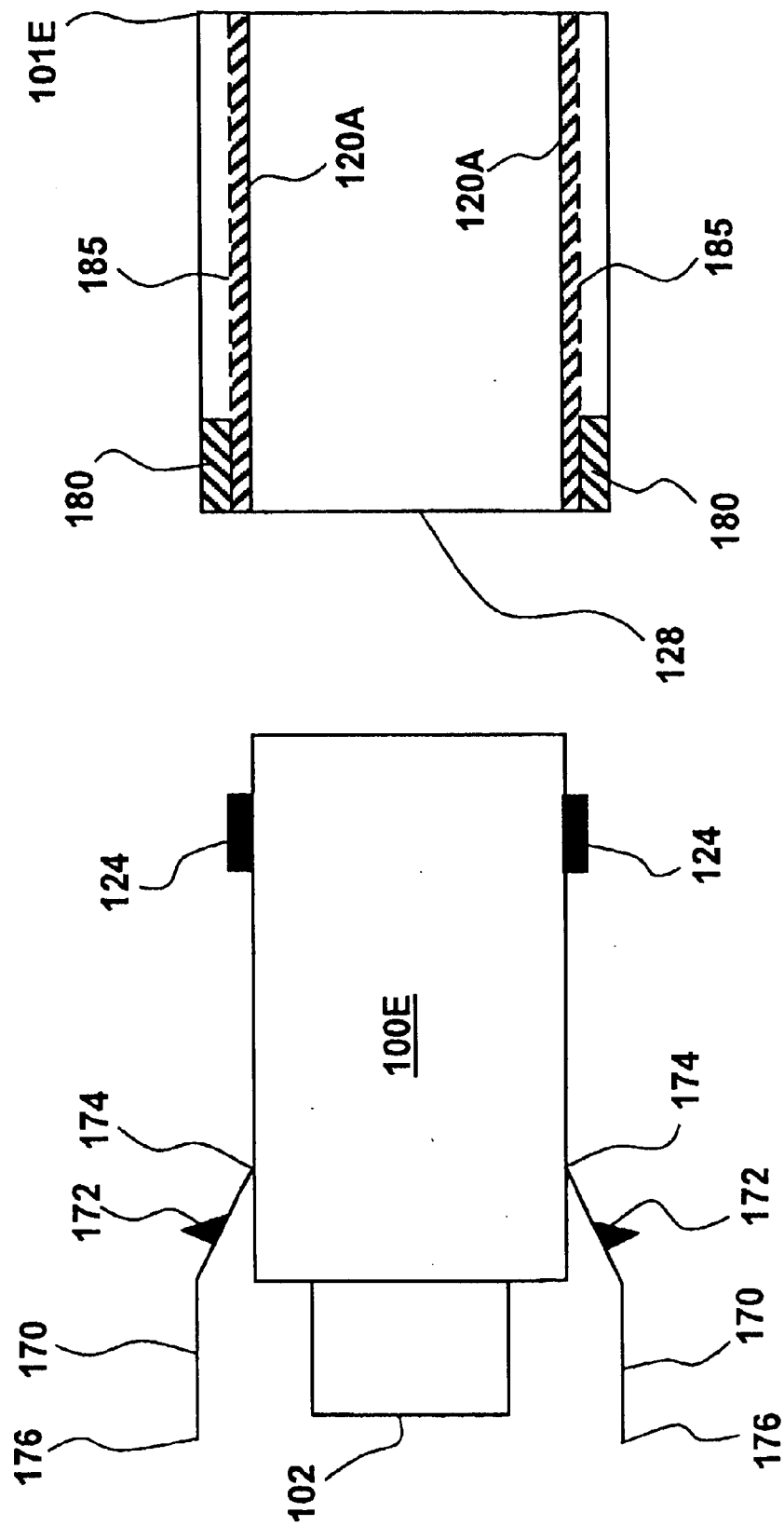

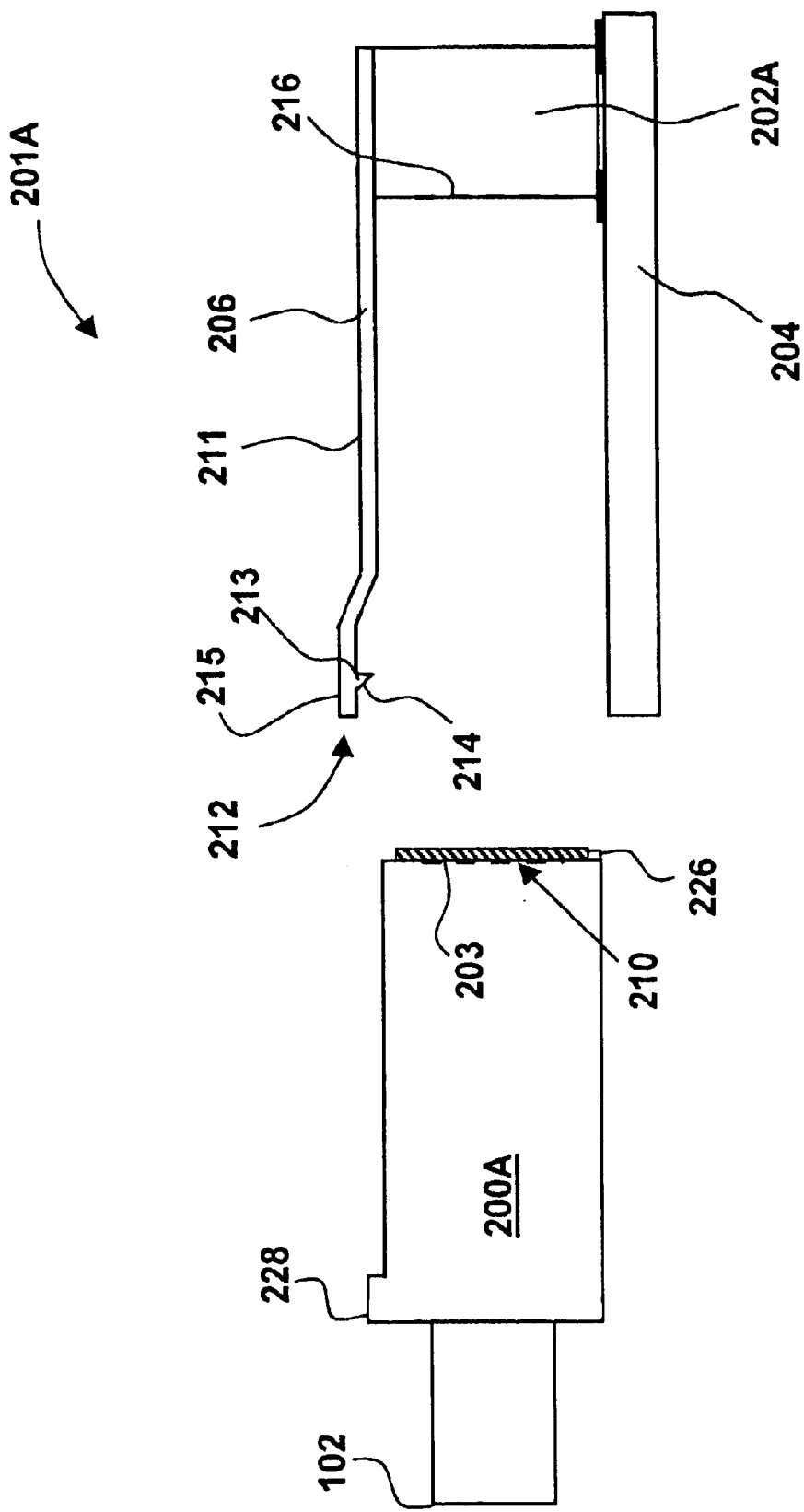

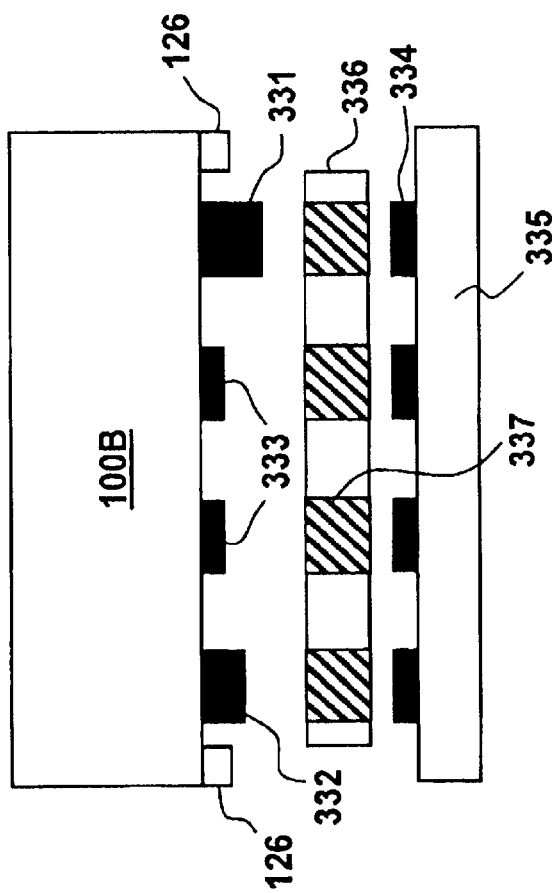
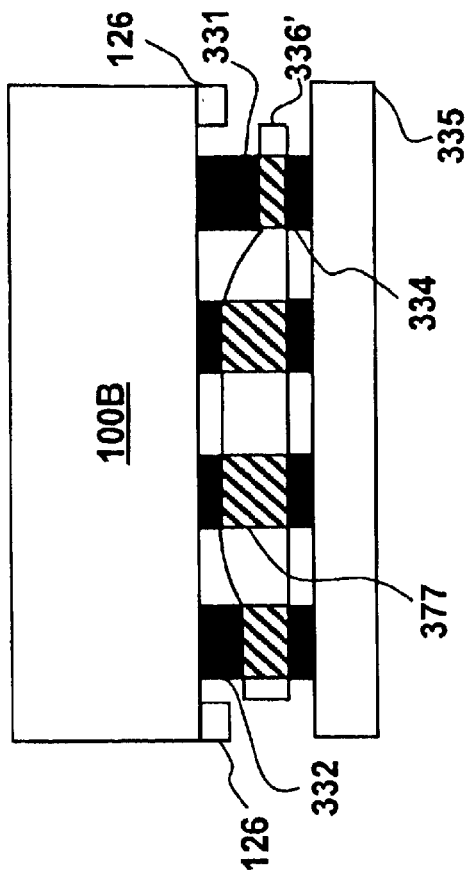

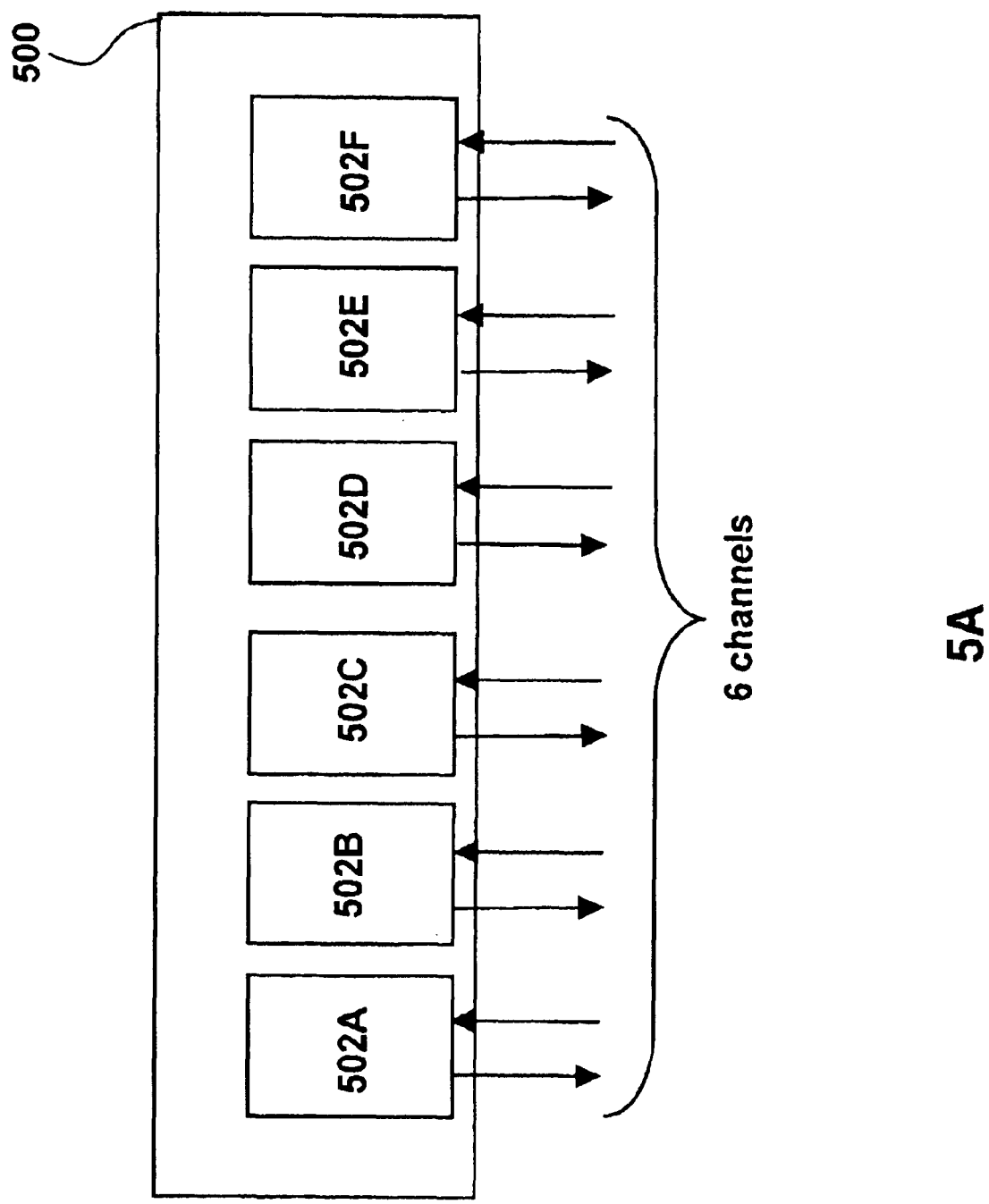
5A

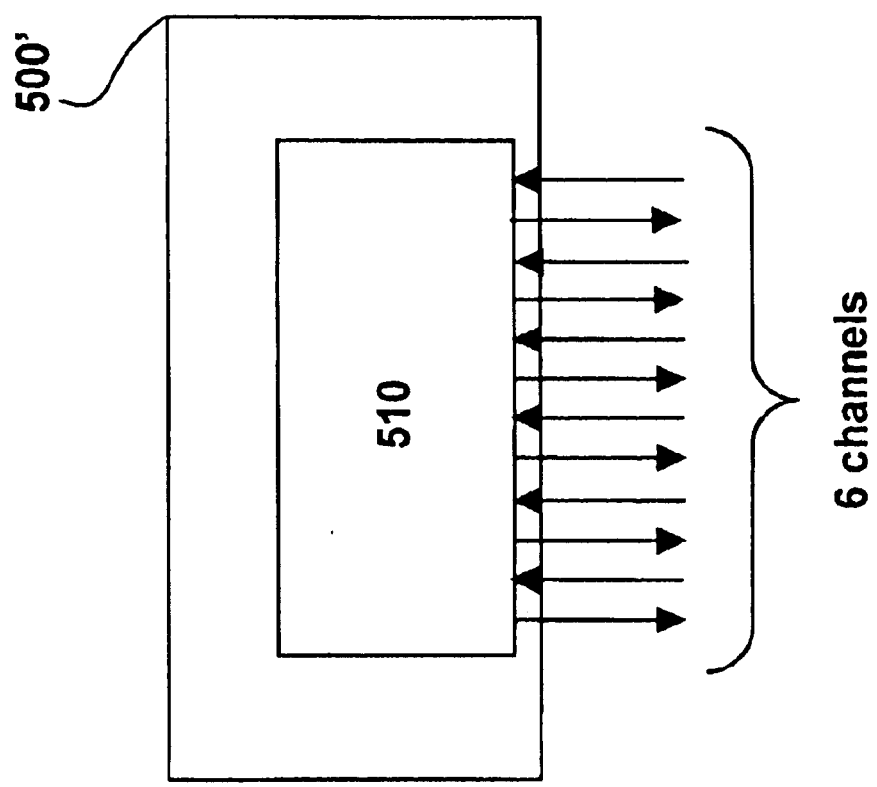

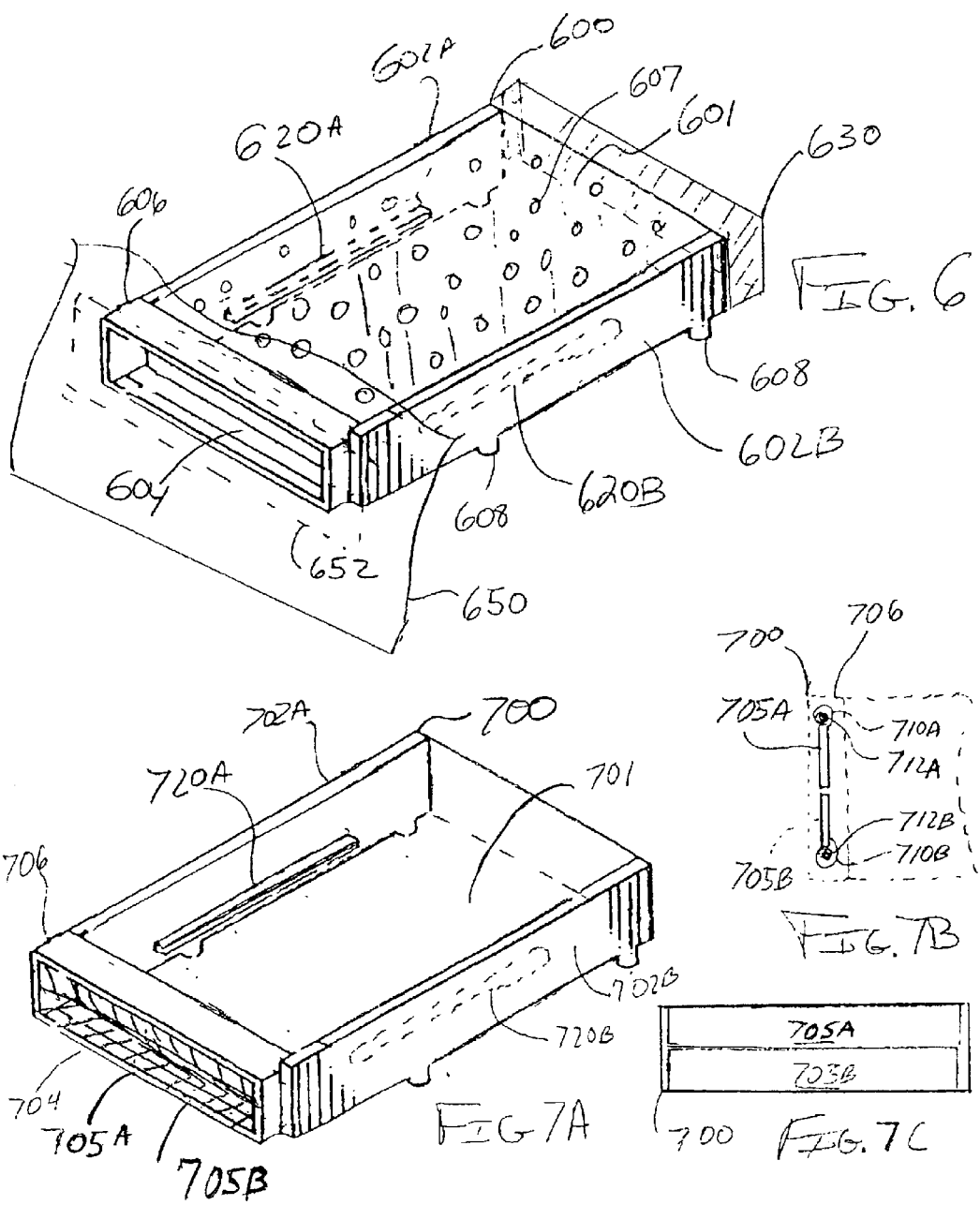

METHODS, APPARATUS, AND SYSTEMS OF FIBER OPTIC MODULES, ELASTOMERIC CONNECTIONS, AND RETENTION MECHANISMS THEREFOR

CROSS REFERENCE TO RELATED APPLICATIONS

This non-provisional United States (U.S.) patent application claims the benefit of U.S. Provisional Application No. 60/265,181 filed on Jan. 29, 2001 by inventors Alain Shang et al. entitled "HOT-PLUGGABLE PARALLEL DATA CONNECTED FIBER OPTIC MODULES USING ANISO-TROPIC ELASTOMER".

FIELD OF THE INVENTION

This invention relates generally to fiber optic modules. More particularly, the invention relates to retention mechanisms, electrical connectors, and electrical connections for fiber optic modules.

BACKGROUND OF THE INVENTION

Fiber optic modules can transduce electrical data signals to transmit optical signals serially over optical fibers. Fiber optic modules can transduce optical signals received serially over optical fibers into electrical data signals. The electrical data signals can be coupled into and out of a fiber optic module through a serial data connection or a parallel data connection. A serial data connection can use few serial data input/output pin connections to serially transmit or receive electrical data signals. A parallel data connection uses parallel data input/output pin connections to transmit or receive electrical data signals in parallel. However for the same bit rate over data input/output pin connections, a parallel data connection can transmit data out of or receive data into a fiber optic module at a greater aggregate data rate.

The size or form factor of fiber optic modules is important. The smaller the size or form factor of a fiber optic module, the less space taken on a printed circuit board to which it couples. A smaller size or form factor allows a greater number of fiber optic modules to be coupled onto a printed circuit board to support additional communication channels. It is difficult to provide a parallel data connection for a fiber optic module in a small size form factor.

When a fiber optic module embedded in a system fails it is desirable to replace it, particularly when other communication channels are supported by other operating fiber optic modules. Thus, it is desirable to replace a failed fiber optic module while the system is operational without having to power down the system. It is desirable to plug-in a new fiber optic module while the system is still hot. In a printed circuit board, hot-pluggability is provided on an edge of card by staggering signal traces from the power and ground traces. That is, when a printed circuit board is plugged into a hot system, power and ground are first supplied to the power and ground traces on the printed circuit board before the data signals are applied to signal traces and the circuitry therein. It is easier to provide hot-pluggability for a fiber optic module having a serial data connection because of the few serial data I/O pins. It is more difficult to provide hot-pluggability for a fiber optic module having a parallel data connection because of the higher count of parallel data I/O pins.

BRIEF DESCRIPTIONS OF THE DRAWINGS

FIG. 1I is a magnified view of a portion of FIG. 1H.

FIG. 1M is a top view of the fiber optic transceiver module of FIG. 1L disengaged from the module receptacle.

FIG. 1O is a side cutaway view of an alternate embodiment of the fiber optic transceiver module of FIG. 1A disengaged from a module receptacle.

FIG. 2A is a side view of a fiber optic transceiver module disengaged from a module receptacle for another embodiment of the invention.

FIG. 3C is an exploded cross-sectional side view of an uncompressed state of a first elastomer between sequentially engaging fiber optic transceiver module contacts and host printed circuit board contacts of the host printed circuit board.

FIG. 3D is an exploded cross-sectional side view of a compressed state of a first elastomer between sequentially engaging fiber optic transceiver module contacts and host printed circuit board contacts of the host printed circuit board.

FIG. 5A is a block system diagram of multiple fiber optic modules providing multiple full duplex communication channels.

FIG. 5B is a block system diagram of a single fiber optic transceiver module providing multiple full duplex communication channels.

FIG. 6 is a perspective view of an embodiment of a cage or module receptacle assembly with an integrated shield.

FIGS. 7A–7C are views of an embodiment of a cage or module receptacle assembly with a pair of flaps to shield an opening.

DETAILED DESCRIPTION OF THE PREFERRED EMBODIMENT

Figure 1A:
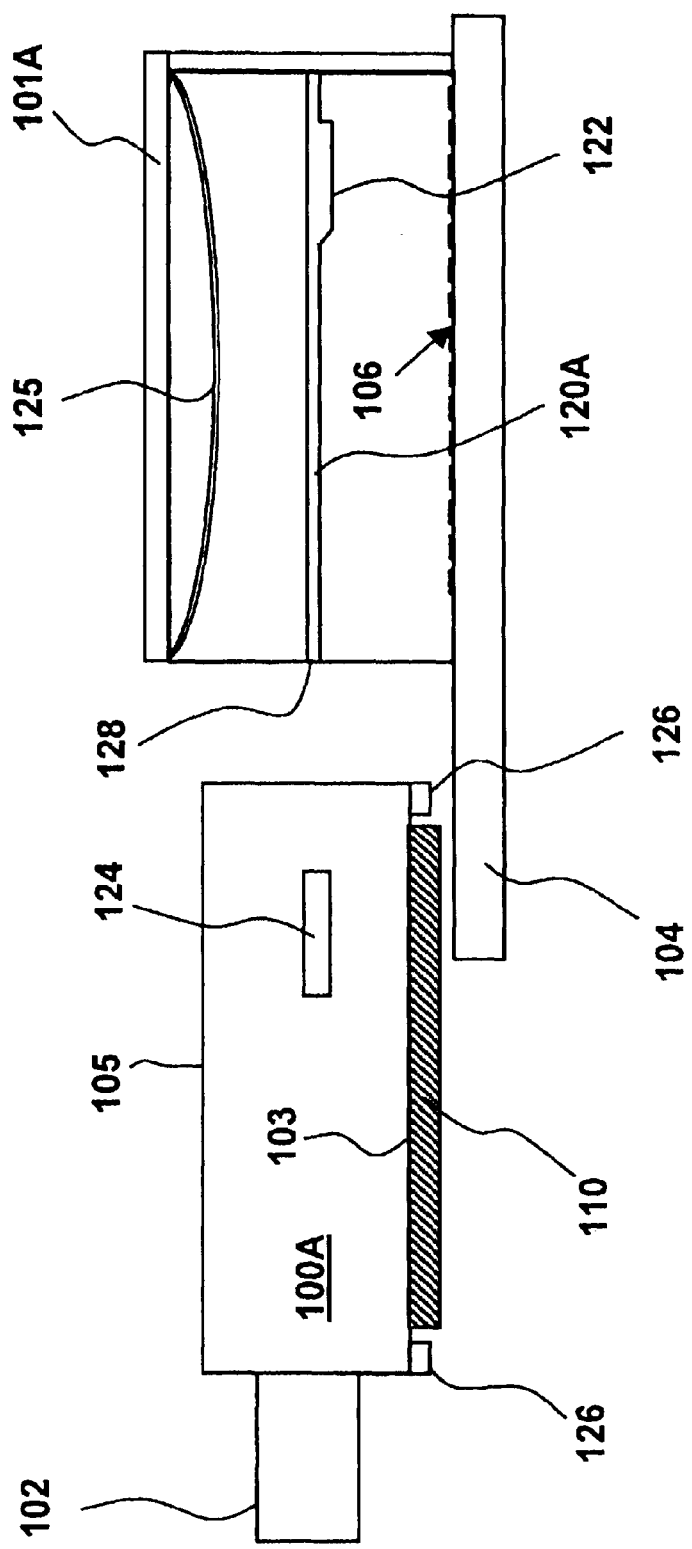
FIG. 1A is a side view of a fiber optic transceiver module disengaged from a module receptacle for a first embodiment of the invention.

In the following detailed description of the invention, numerous specific details are set forth in order to provide a thorough understanding of the invention. However, it will be obvious to one skilled in the art that the invention may be practiced without these specific details. In other instances well known methods, procedures, components, and circuits have not been described in detail so as not to unnecessarily obscure aspects of the invention.

In the following description, certain terminology is used to describe various features of the invention. For example, a "parallel fiber-optic transceiver" is a fiber optic module having one or more parallel channels of optical signal transmit and receive capability as well as a parallel data connection for electrical signals. Fiber-optic module generally refers to fiber-optic transmitter modules, fiber-optic receiver modules, and fiber-optic transceiver modules. The various fiber-optic modules can also be referred to as optical fiber transmitter, receiver or transceiver modules; optoelectronic transmitter, receiver or transceiver modules; electro-optic transmitter, receiver or transceiver modules; fiber optic data links; fiber optic links; optical fiber links; or optical links. The fiber optic modules may also be referred to as being pluggable, removable, replaceable, or releasable.

Parallel fiber-optic transceivers are commonly used in network systems for linking network switches and processing nodes together in a bus or a fan-out architecture. From a system point of view, it is important to be able to replace a parallel fiber optic transceiver module (for repair or upgrades for example) while the system is operational. Thus the desirability to provide hot-pluggability. The fiber optic transceiver module and the host system of the invention are connectorized to easily and quickly insert/remove the transceiver. Parallel fiber optic transceiver modules have many more I/O connections than single channel fiber optic transceiver modules (I/O's numbering in hundreds) which typically increases a linear dimension of the connector thereby making mechanical insertion difficult. Adding to the difficulty, parallel fiber optic transceiver modules typically need to be plugged in parallel to the plane of the board. This is because in an active system such as a backplane, the board pitch is too tight (e.g. ~25 mm).

The invention provides the ability to connect and disconnect a fiber optic transceiver having a parallel data connection from a host printed circuit board while the host system is operational or 'hot'. This capability is referred to as "hot pluggability" or a hot-pluggable connection. Hot-pluggable electrical connections including a parallel data connection can be made between a fiber optic module and a host printed circuit board in a small form factor. Parallel electrical connections can increase electrical signal data rates between a fiber optic module and a host printed circuit board. It is desirable to provide hot-pluggable parallel data connections for fiber optic modules having small size form factors.

A number of embodiments of the invention provide the ability to sequentially provide or remove power to the module to prevent damage to electrical functionality. The sequential power on and sequential power off functionality is accomplished by physically spacing or otherwise orienting the electrical connections so that the electrical connections are selectively made as the fiber optic module is physically inserted or removed from the host system. In this embodiment, the first electrical contact is chassis ground, followed by signal ground, then power, and finally signal I/O. Chassis ground contact is made when the fiber optic housing guide is first inserted into the host rail system, any static charges are shunted to ground. The next set of electrical connections is the signal ground connection between host board and fiber optic module for a common electrical reference. The third set of electrical connections is the power that turns on the module. The final set of electrical connections is the signal I/O between host PCB and fiber optic module. Upon power down, the sequence of electrical connections is reversed as the module is physically removed from the host PCB.

A number of embodiments of the invention provide a parallel optical fiber transceiver module with a mechanical system, such as a retention mechanism, to establish electrical contacts to a system board when it is mechanically plugged in place. The contacts or pin-outs of the parallel fiber optic transceiver module can be on its bottom surface or protruding out from its perimeter surface, including its back side, left side and right side. The electrical interface with the system board is designed to minimize electrical reflections due to impedance mismatches and to provide for multi-gigahertz data frequencies.

The parallel fiber optic transceiver module couples into a module receptacle or cage of the system board. The module receptacle or cage is grounded so that it functions as an EMI shield as well as an Electro-static Discharge (ESD) device. The module receptacle or cage also includes a mechanical connecting system. The mechanical connecting system is the part that guides and holds the parallel fiber optic transceiver module to the system board. A second function of the mechanical connecting system establishes electrical connections between the fiber optic transceiver module and the system board or host printed circuit board.

The guiding system guides the parallel fiber optic module as it is inserted into the module receptacle in parallel with the plane of the system board. After the parallel fiber optic transceiver module is properly positioned on the board by the guiding rail system, a retention mechanism locks the parallel fiber optic transceiver module in place to make electrical connections with the board.

Referring now to FIG. 1A, a side view of a fiber optic module 100A disengaged from a module receptacle 101A for a first embodiment of the invention is illustrated. The module receptacle 101A can also be referred to herein as a module cage or cage. The fiber optic module 100A includes one or more optical fiber connectors 102 at a front-side to connect to one or more optical fibers. The fiber optic module 100A further includes one or more optoelectronic transducers to convert optical signals into electrical signals (optoelectronic receiver) or to convert electrical signals into optical signals (optoelectronic transmitters) or both. The fiber optic module 100A additionally includes a plurality of contacts 103 at a base of the module to make a base electrical connection. The contacts 103 of the fiber optic module may also be referred to as pads. To shield and protect the optoelectronic and electrical components, the fiber optic module 100A further includes a housing or cover 105. The housing or cover 105 may be conductive to provide RF, EMI shielding and or to dissipate electrostatic charges. The housing or cover 105 may be metal or metalized plastic.

Figure 1B:
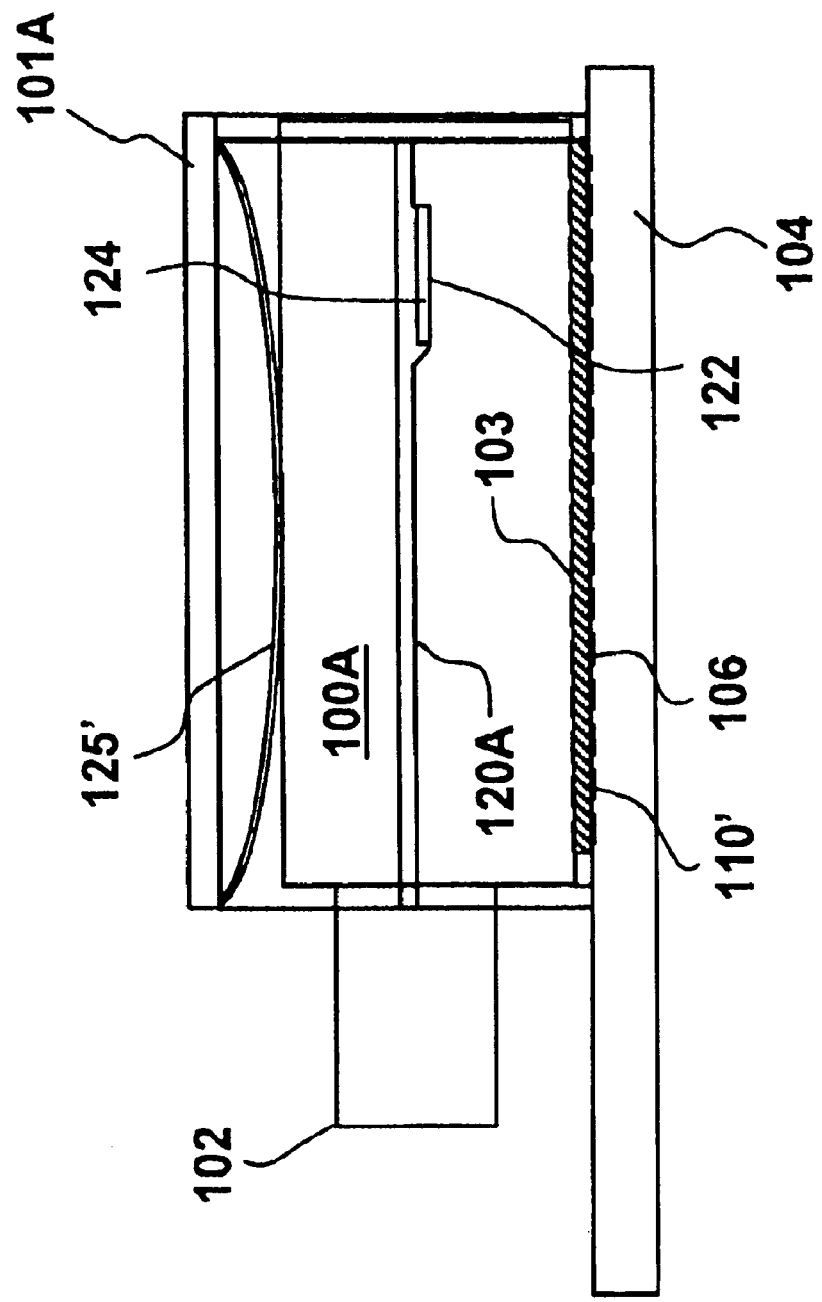
FIG. 1B is a side view of the fiber optic transceiver module of FIG. 1A engaged in the module receptacle.

FIG. 1B is a side view of the fiber optic transceiver module 100A of FIG. 1A engaged in the module receptacle 101A. As illustrated by FIG. 1B, the module receptacle 101A couples to a host printed circuit board (PCB) 104 around a plurality of host contacts 106. The contacts 106 of the host PCB can also be referred to as pads. The host pads or contacts 106 align with the module pads or contacts 103 when the module 100A is engaged within the module receptacle 101A.

The first embodiment of the invention utilizes a guiding rail system in order to mechanically engage the fiber optic transceiver module 100A and the module receptacle 101A. The module receptacle 101A includes a front opening in order to receive the fiber optic module 10A. The first embodiment of the invention utilizes an elastomer Z-connector or interposer 110 to electrically connect module contacts or pads 103 to the host contacts 106 to provide a parallel data connection. The interposer 110 may also be referred to as an elastomer connector, a patterned mat, or an elastomer. In one embodiment, the interposer 110 is loosely coupled to the fiber optic transceiver module 10A. In another embodiment, the interposer 110 is loosely coupled to the host contacts 106.

FIG. 1A illustrates the fiber optic module 100A disengaged from the guide rail system. FIG. 1B illustrates the fiber optic module 100A engaged within the guide rail system. The guide rail system includes left-side and right-side guide rails 120A mounted onto the host PCB and can be a part of the module receptacle 101A. One or both of the guide rails 120A of the receptacle module 101A includes a cage stop 122 near its back side. The guide rails 120A are passive components to physically attach the fiber optic module 100A to the host PCB. The guide rail system further includes left side and right side guides 124 of the fiber optic module. The guides 124 of the fiber optic module may also be referred to as guide tabs 124. Each of the guide rails 120A may include a slot or step along which the guides 124 can slide. The left side and right side guides 124 are part of left and right sides of the body or housing of the fiber optic module 10A. The left-side and right-side guides 124 are an active part of the guide rail system in order to engage the fiber optic module with the module receptacle. The left-side and right-side guides 124 slide along the left-side and right-side guide rails 120A in the module receptacle 101A or cage. The left-side and right-side guide rail 120A ensures that the interposer 110 is not damaged during engagement/disengagement of the fiber optic module 10A. The module receptacle or cage 101A includes a spring 125 which is in a relaxed state as illustrated in FIG. 1A. The spring 125, in one embodiment, is a leaf type spring.

The fiber optic module 100A includes front and rear compression stops 126 on a bottom side to prevent over compression of the interposer 110. Front and rear compression stops 126 are hard and non-compressible. The front and rear compression stops 126 can couple to a top surface of the host PCB 104 in order to avoid over-compression of the interposer 110.

The electrical connection between PCB contacts 106 and the contacts of the fiber optic module 100A is facilitated by the z-connector/interposer 110. The PCB contacts 106 and the contacts 103 of the fiber optic module 100A are both arrays of pads that may be arranged into rows and columns, typically with matching organization to make electrical connections. The number of pads or contacts 103 and 106 in the arrays can allow for an electrical connection having parallel data connections between the fiber optic module and the host PCB. For example, eight pads can provide an 8 bit parallel data connection while an N pad can provide an N-bit parallel data connection. In one embodiment, the z-connector/elastomer is an elastomer with densely packed micro-filaments having a pitch smaller than pad size or the PCB contacts or contacts of the fiber optic module. In another embodiment, the z-connector/elastomer is an elastomer with a patterned mat having filled metal columns. The patterned mat has a pattern which corresponds to pattern of the arrays of pads for the PCB contacts 106 and the contacts 103 of the fiber optic module. In another embodiment, the interposer is an anisotropically conductive elastomer medium. The elastomer medium is filled with conductive particles that only make electrical connections in one direction, through the thickness of the elastomer. The fill of conductive particles is such to ensure that particles do not electrically conduct from one conductive particle to an adjacent particle. To establish the connection between the PCB contacts 106 and the contacts of the fiber optic module through the z-connector/interposer 110, appropriate pressure is applied in a z direction to establish the connection.

Referring now to FIGS. 1A–1B, the parallel fiber optic module 100A is first inserted into a frontal opening 128 in the module receptacle 101A in order to couple them together. The transceiver guide rails 124 are slideably coupled into the guide rails 120A and slid along until the transceiver guides 124 drop into the cage stops 122. As the transceiver guides 124 drop into the cage stops 122, the fiber optic module 100A rests in an engaged position with the transceiver guides 124 resting in the cage stops 122. The leaf spring 125 located inside the top of the cage or module receptacle 101A slideably engages the top of the housing or cover 105 of fiber optic module as it is slides in. As the fiber optic module 101A slides in further, the spring 125 begins to compress and apply a force on the top of the housing or cover 105. Spring 125 is illustrated as compress spring 125' in FIG. 1B with the fiber optic module 100A fully inserted into the module receptacle or cage 101A. The compressed spring 125' presses on top of the fiber optic module 100A to provide a positive force and compress the elastomer 110 into the compressed elastomer 110' illustrated in FIG. 1B. The compression of the elastomer 110 electrically connects the contacts 103 of the fiber optic module to the contacts 106 of the host PCB through conductors in the elastomer 110. The host pads or contacts 106 align with the module pads or contacts 103 and electrically coupled together through the compressed elastomer 110'.

Figure 1C:
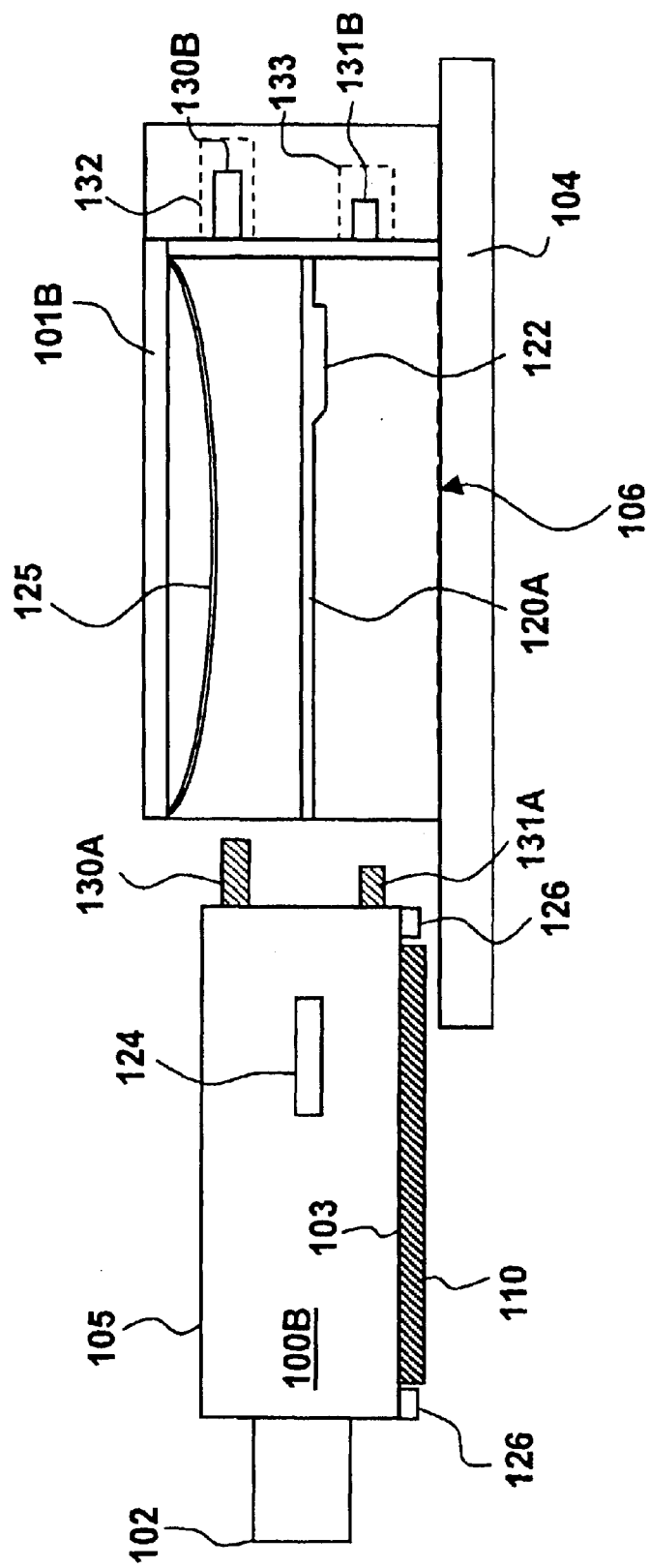
FIG. 1C is a side view of an alternate embodiment of the fiber optic transceiver module of FIG. 1A disengaged from a module receptacle.
Figure 1D:
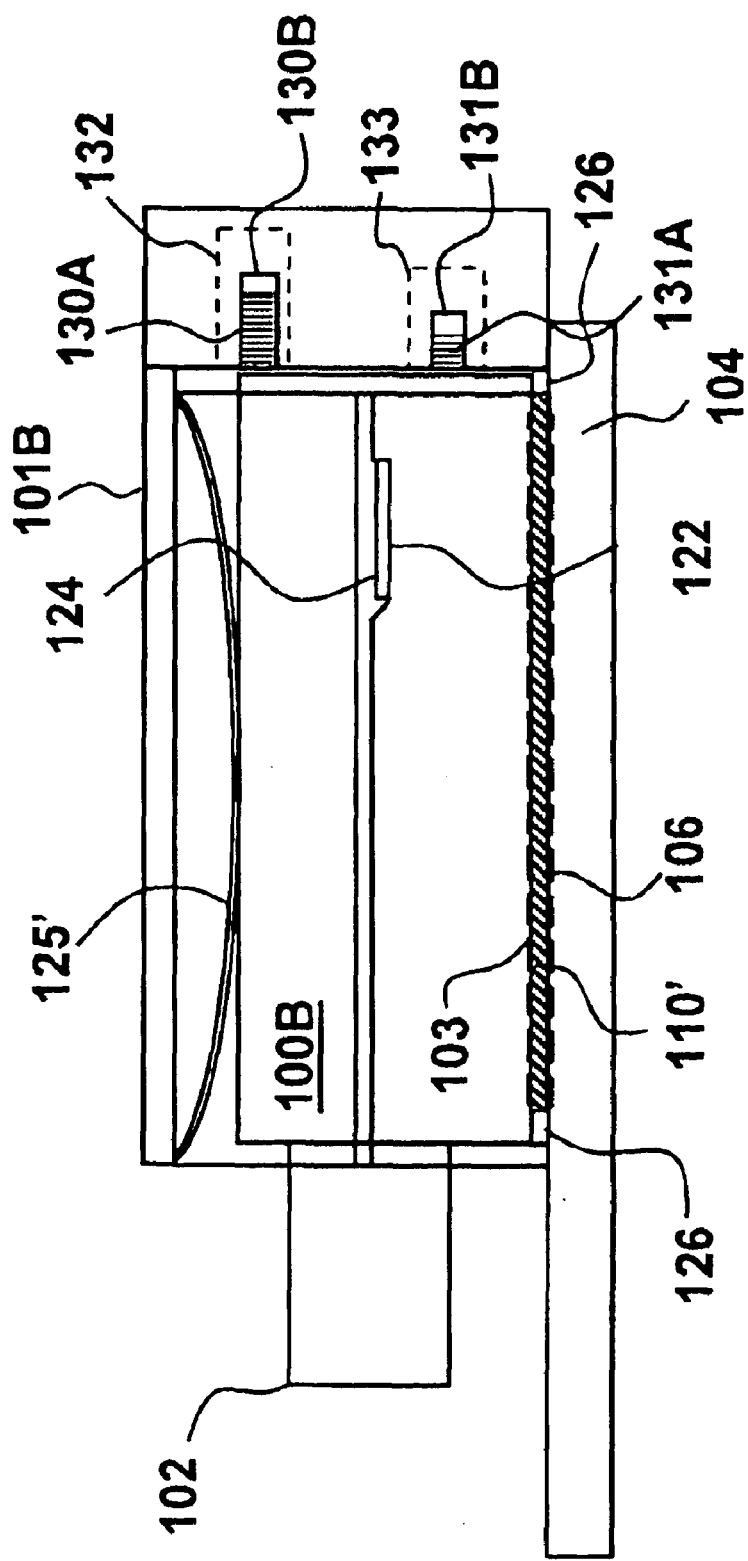
FIG. 1D is a side view of the fiber optic transceiver module of FIG. 1C engaged with the module receptacle.

Referring now to FIGS. 1C–1D, another embodiment of the invention is illustrated. The embodiment of FIGS. 1A–1B are altered to include mechanical power sequencing to provide hot-pluggability without damage to circuitry. Elongated power and ground pins on the back of the fiber optic module 100B can mate with power and ground sockets near the back of the cage assembly or module receptacle 101B. Alternatively, power and ground pads can be elongated over signal pads to provide power sequencing and hot-pluggability. Additionally, the guides 124 can be grounded when they make contact with the guide rails 120A if they are coupled to a ground connection of the host printed circuit board and/or chassis. The ground and power pins are part of the mechanical contacting system.

FIG. 1C illustrates the power pin 131A and ground pin 130A and their respective sockets 131B and 130B with the fiber optic module 100B ejected or disengaged from the cage or receptacle 101B. FIG. 1D illustrates the pins 130A and 131A engaged into their respective sockets 130B and 131B with the fiber optic module engaged with the cage or receptacle. The sockets 130 and 131B may be part of an electrical connector. The electrical connector may be coupled to the host PCB within the perimeter of the cage or receptacle 101B or alternatively couple outside the perimeter of the cage or receptacle 101B to its back side. Other elements of the embodiment of the fiber optic module 100B and cage 101B are somewhat similar to the embodiments of the fiber optic module 100A and cage 101A with like elements having the same reference numbers.

The parallel fiber optic module 100B is first inserted first inserted into a frontal opening 128 in the module receptacle 101B in order to couple them together. The transceiver guide rails 124 are slideably coupled into the guide rails 120A and slid along until the transceiver guides 124 drop into the cage stops 122. With the guide rails connected to ground of the host PCB or system board, as the module slides into the cage or receptacle 101B the guides 124 can shunt static charges to the guide rail 120, effectively grounding out static charges. That is, each guide 124 and guide rail 120 may provide electrostatic discharge (ESD) to ground prior to forming other electrical connections. The connection of the guide rails and guides to ground may be separate from the connection to ground of the electronics within the fiber optic module. In this case, the former may be referred to as chassis ground and the later may be referred to as signal ground. As the module 100B slides further into the cage or receptacle 101B, the signal ground pin 130A makes contact with the signal ground socket 130B and ensures a common electrical reference between host system and fiber optic module 100B. The next set of the electrical connections made is between the power pin 131A and the power socket 131B which provides power to the fiber optic module. Each of the respective sockets 130B and 131B has play or flop. That is the sockets 130B and 131B can move up and down with respect to the host printed circuit board 204 in order to allow the fiber optic module 100B to move to compress the elastomer 110 and make the data signal electrical connections. This is illustrated by the change in position of the sockets 130B and 131B with respect to the boundaries 132 and 133, respectively. In FIG. 1C, when the module is disengaged from the receptacle, the sockets 130B and 131B are nearer the top of the boundaries 132 and 133 ready to receive the pins 130A and 131B respectively. In FIG. 1D, when the module is engaged within the receptacle, the sockets 130B and 131B are nearer the bottom of the boundaries 132 and 133 which allowed the compression of the elastomer 110 to the compressed elastomer 110'.

The last electrical connections are made when the module is fully engaged and the elastomer 110 is compressed to make the signal or data connections between the host system PCB pads 106 and the fiber optic module pads 103. The staggering connection between ground, power and then the signal pads in the parallel fiber optic module 100B provides for hot-pluggability.

Figure 1E:
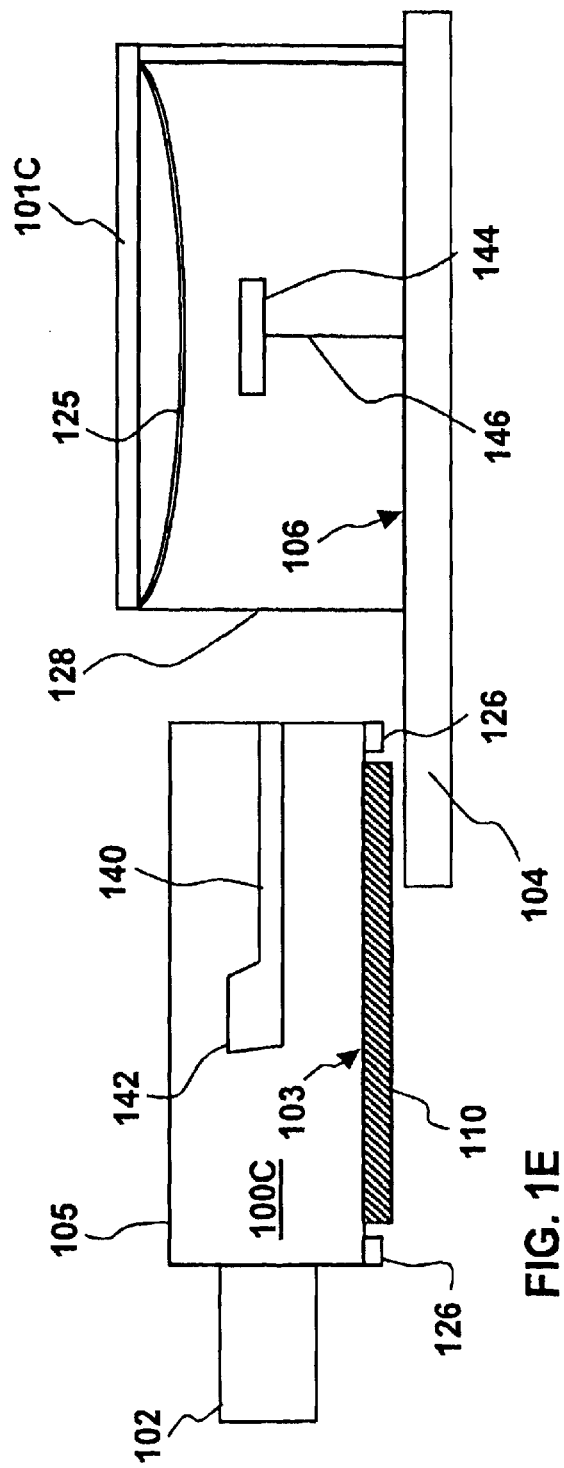
FIG. 1E is a side cutaway view of an alternate embodiment of the fiber optic transceiver module of FIG. 1A disengaged from a module receptacle.
Figure 1F:
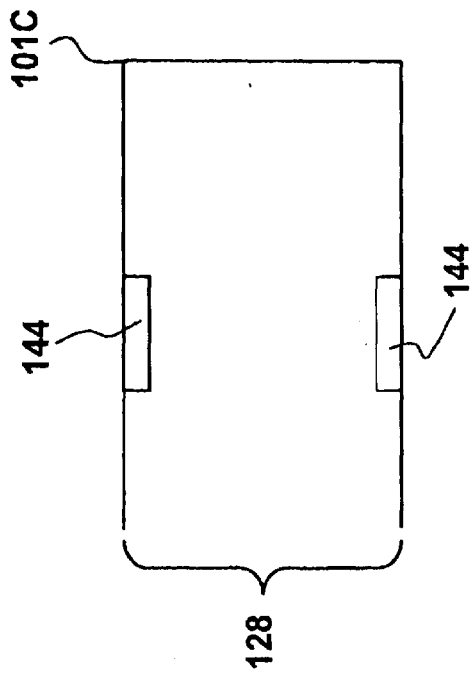
FIG. 1F is a top cutaway view of the module receptacle of FIG. 1E.
Figure 1G:
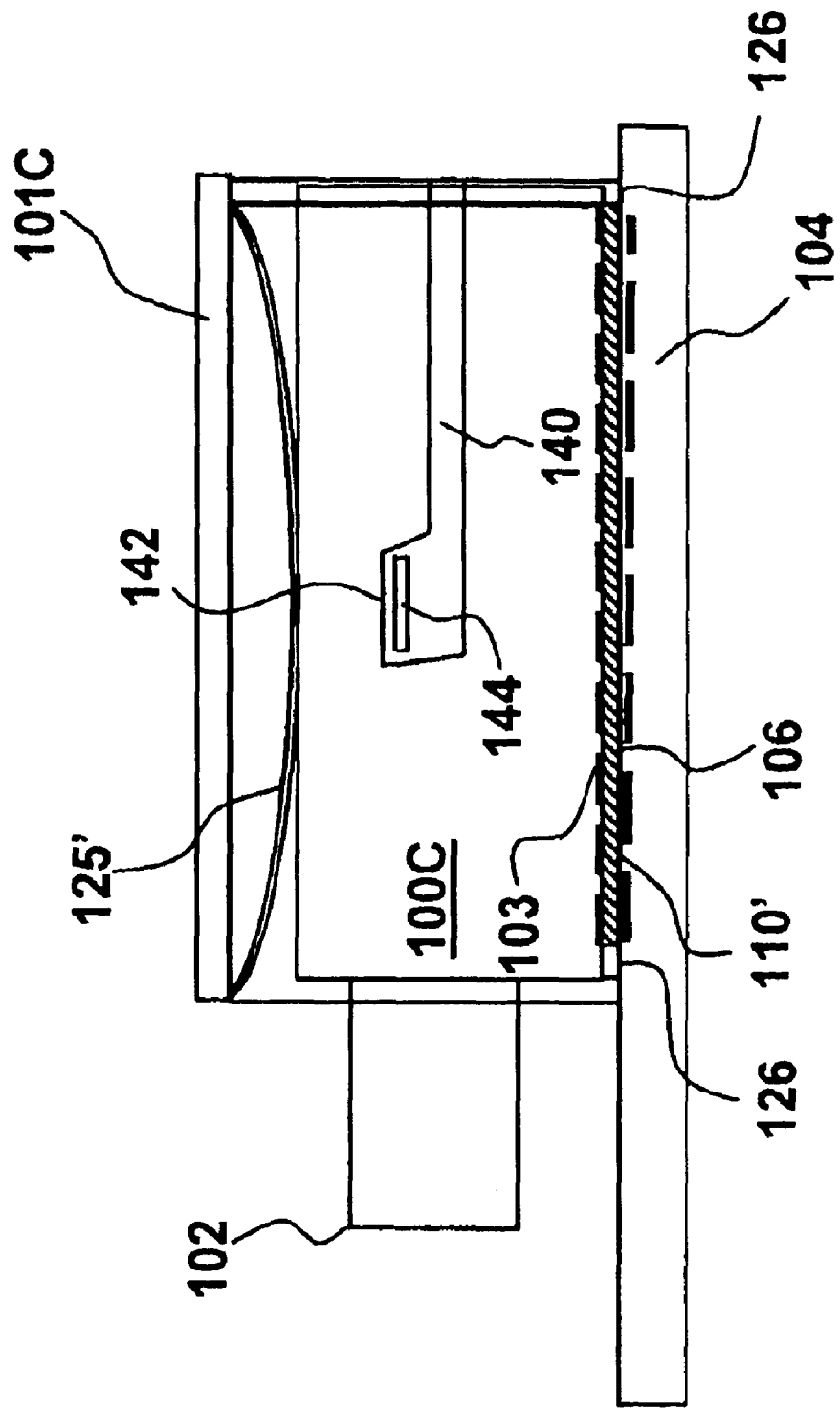
FIG. 1G is a side cutaway view of the fiber optic transceiver module of FIG. 1E engaged with the module 20 receptacle.

Referring now to FIGS. 1E–1G, another embodiment of the invention is disclosed. In this embodiment, the fiber optic module 100C includes guide slots 140 within each outer side in contrast to the guide 124 of the fiber optic module 100A. Each of the guide slots 140 includes a guide stop slot 142. The cage or receptacle 101C includes a pair of guides or guide tabs 144 extending from each inner side. The guide tabs 144 may be coupled to or integrated with each side of the cage or receptacle 101C or alternatively, the guide tabs 144 may be separately supported by support posts 146 as illustrated in FIG. 1E. FIG. 1F, a top cutaway view of the cage or receptacle 101C, illustrates the guide tabs 144 coupled to or integrated with each inner side and extending therefrom. If conductive, the guide tabs 144 can ground out the housing of the fiber optic module through a ground connection to the host PCB. FIG. 1G, a side cutaway view, illustrates the fiber optic module 100C engaged with the cage or receptacle 101C. Other elements of the embodiment of the fiber optic module 100C and cage 101C are somewhat similar to the embodiments of the fiber optic module 100A and cage 101A with like elements having the same reference numbers.

As the fiber optic module 100C slides along its guide slots 140 over the guide tabs 144 it reaches beginning of the guide stop slots 144. At this point the spring 125 pushes the fiber optic module 100C towards the plane of the host printed circuit board 104 such that the guide tabs 144 move up and into the guide stop slots 142. The guide tabs 144 and guide stop slots 142 are illustrated near the center but can be moved off center towards ends of cage 101C and fiber optic module 100C, respectively. In such one case, the guide stop slots 142 are nearer the optical fiber connector 102 while the guide tabs 144 are nearer the opening 128 in order to provide earlier guidance of the fiber optic module 100C and earlier grounding of the housing.

Additionally, the fiber optic module 100C and cage 101C can be altered to provide hot pluggability such as through the ground pin 130A and power pin 131A and sockets 130B and 131B or extended power and ground pads as previously discussed and which is further discussed below. Otherwise, the electrical connections are formed similarly to that discussed with reference to the fiber optic module 100A and the cage 101A.

Referring now to FIGS. 1H–1K, another embodiment of the invention is disclosed. In this embodiment, guide rails of the cage or module receptacle are mechanically connected to a lever system that moves the guide rails up and down in the z-direction.

After the fiber optic module is inserted into the cage the rails are moved down by the lever system. With the fiber optic module engaged within the guide rails, it moves up and down by the lever system as well. As the lever is moved, the fiber optic module and guide rails are moved towards a plane of a host PCB and electrical connections are made through the elastomer z-connector or interposer. That is, the lever system can adjust the distance between the guide rails and the host PCB.

Figure 1H:
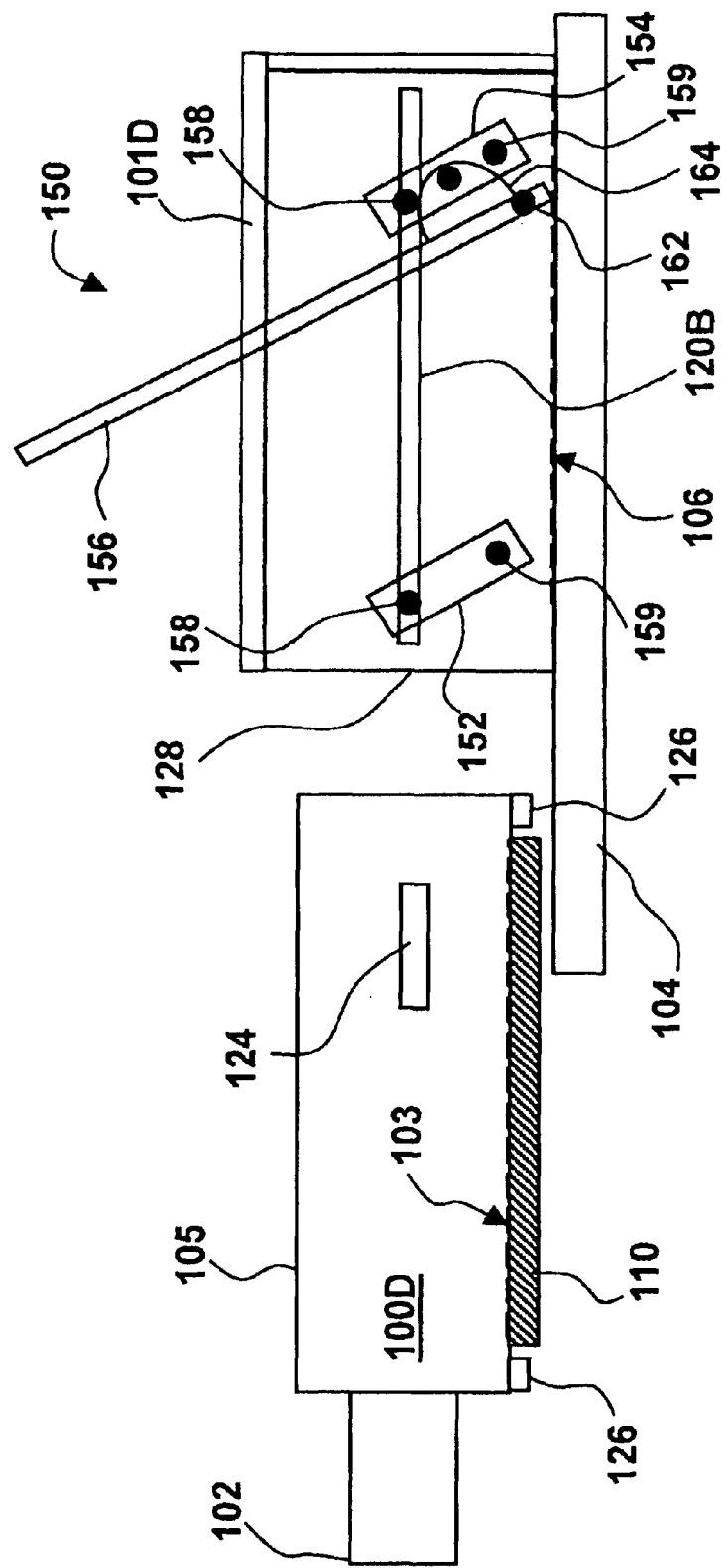
FIG. 1H is a side cutaway view of an alternate embodiment of the fiber optic transceiver module of FIG. 1A disengaged from a module receptacle.
Figure 11:
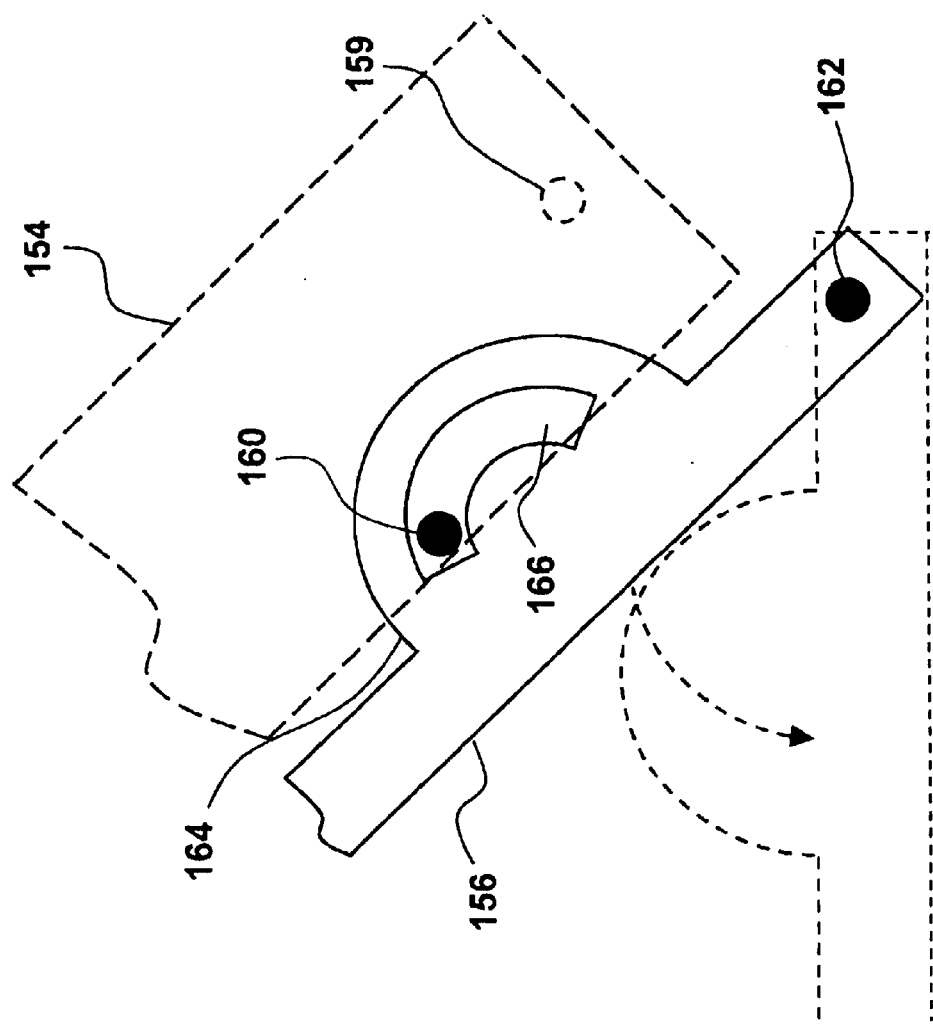

Referring to FIG. 1H, a cage or receptacle 101D includes a lever system 150 for the guide rails 120B. The guide rails 120B may be referred to as moveable guide rails. In FIG. 1H, the lever system 150 is open to allow the insertion of a fiber optic module 100D into the cage 101D. The fiber optic module 100D may be similar to fiber optic modules 101A or 101B. With the lever system 150, the cage 101D may forgo the spring 125 of the cage 101A. The lever system 150 includes the guide rails 120B, a pair of pivot arms 152 for one end of each of the guide rails 120B, another pivot arm 152 for an opposite end of one of the guide rails 120B, a pivot arm 154 for an opposite end of the other one of the guide rails 120B, and a lever arm 156. Each of the pivot arms 152 and 154 includes a pair of pivot points 158 and 159 about which the pivot arm 154 can move and allow the guide rails 120B to move up and down with respect to the plane of the host PCB 104. The pivot points 158 rotatably couple the pivot arms 154 and guide rails 120B together. The pivot points 159 rotatably couple the pivot arms 154 to sides of the cage 101D. The pivot arm 154 includes a pin 160 to engage the lever arm 156. Other elements of the embodiment of the fiber optic module 100D and cage 101D are somewhat similar to the embodiments of the fiber optic module 100A and cage 101A with like elements having the same reference numbers.

Referring now to FIG. 1I, a magnified view of a region of FIG. 1H is illustrated. In FIG. 1I, the lever arm 156 is in an open position and includes a pivot point 162 and a cam 164. The pivot point 162 rotatably couples the lever arm 156 with a side of the cage 101D. The pivot points 158, 159 and 162 may be round pins upon which the respective member can rotate. The cam 164 has an arc shaped opening 166 into which the pin 160 can be inserted. The arc shaped opening 166 of the cam 164 rotates when the lever arm 156 is pushed. As the cam 164 rotates, the pin 160 slides within the arc shaped opening 166 in order to move the pivot arm 154 and the guide rails 120B down towards the plane of the host PCB 104. The arc shaped opening 166 of the cam 164 may be progressive and have a tighter radius in order to provide more movement in the pivot arm 154 and the guide rails 120B down towards the plane of the host PCB 104.

The lever system can apply a force to one guide rail 120B and one side of a fiber optic module while the other guide rail passively moving through the force applied to the one guide rail. Alternatively, a joint force can be applied to the guide rails 120B to assure joint movement by mechanically coupling the guide rails together or by mechanically coupling together a pair of the pivot arms coupled to each respective guide rail 120B.

In an alternate embodiment, one of the guide rails 120B may include the pin 160 into which the opening 166 in the cam 164 can engage, with corresponding modifications to the position of the lever arm 156 within the cage 101D and the cam 164 on the lever arm 156. In another alternate embodiment, at least one of the guide rails 120B may include the cage stop 122 to engage the guides 124 to stop further movement of the fiber optic module into the cage 101D In another alternate embodiment it may desirable to remove the lever arm 156. Without the lever arm 156, the spring 125 may be included in the cage 101D to force the fiber optic module 100D toward the plane of the host PCB 104 thereby causing the pivot arms 152 and the guide rails 120B to move as well.

Figure 1J:
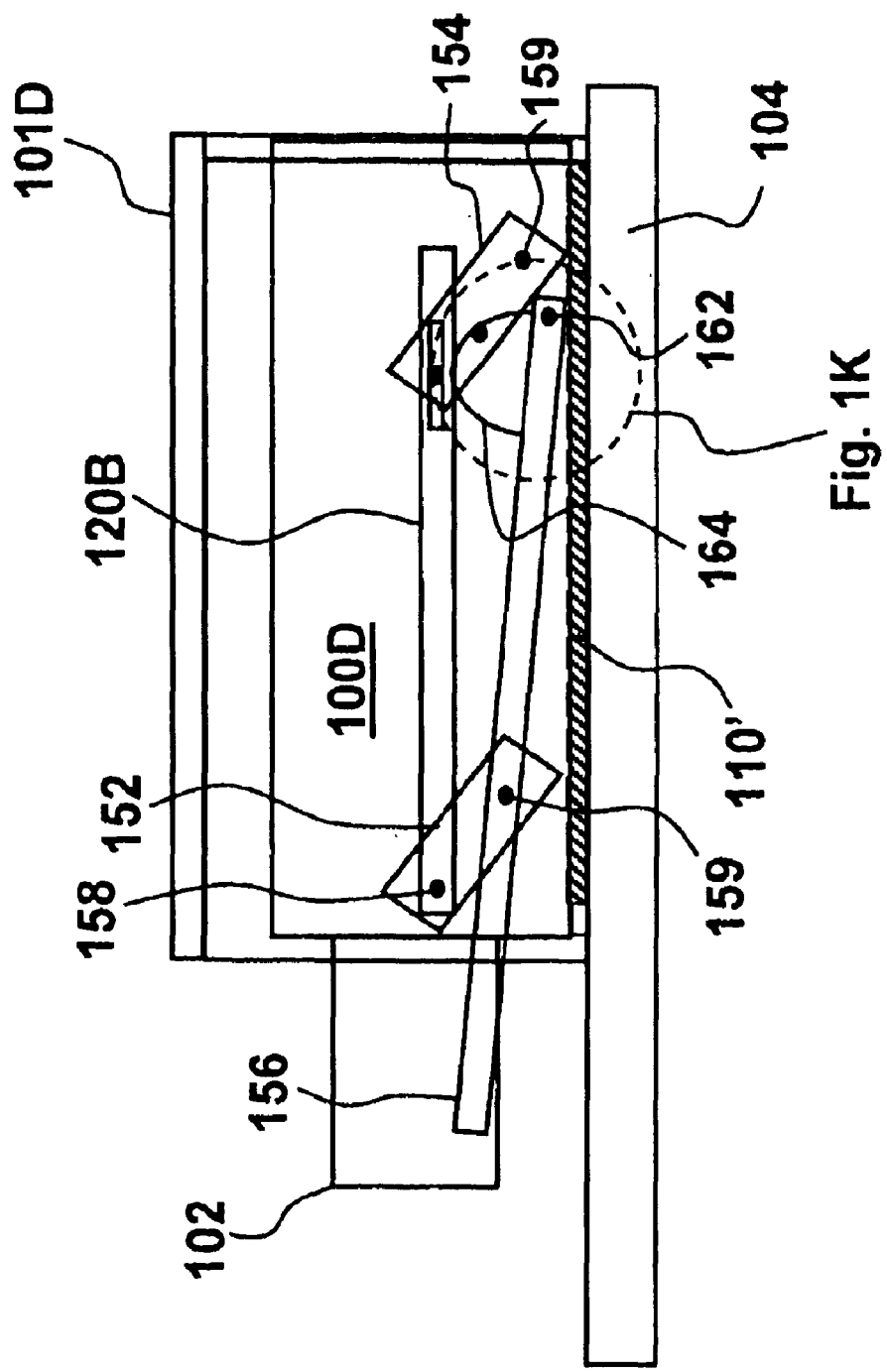
FIG. 1J is a side cutaway view of the fiber optic transceiver module of FIG. 1H engaged with the module receptacle.
Figure 1K:
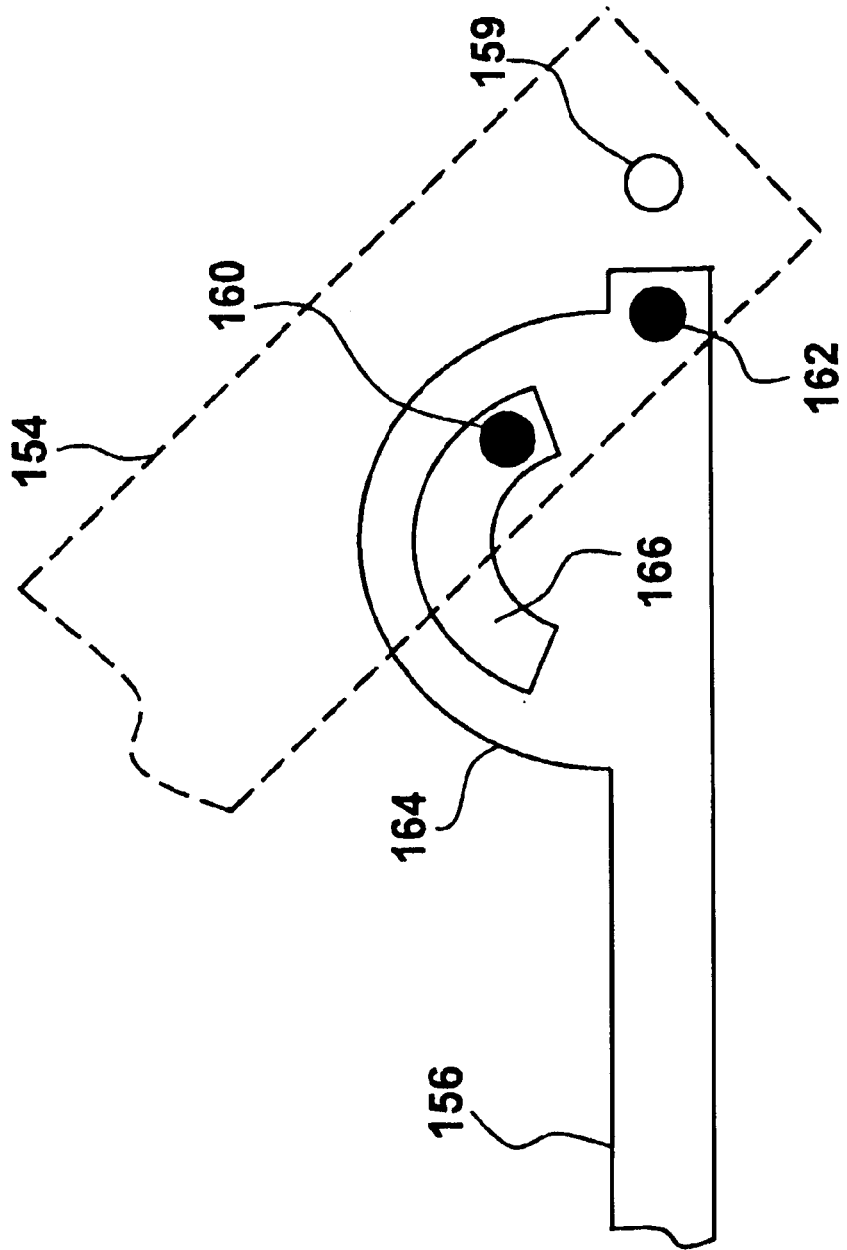
FIG. 1K is a magnified view of a portion of FIG. 1J.

Referring now to FIGS. 1J–1K, the fiber optic module 100D is engaged with the cage 101D and the lever system 150 is closed such that the elastomer 110 is compressed as elastomer 110' to make electrical connections between the fiber optic module 100D and the host PCB 104. The guides 124 of the fiber optic module 100D are engaged with the movable guide rails 120B and the lever arm 156 has been rotated such that the guide rails 120B are moved closer to the host PCB 104 forcing the fiber optic module 100D down to compress the elastomer 110 and make electrical connections. FIG. 1K illustrates a magnified view of a portion of FIG. 1J. In FIG. 1K, the lever arm 156 is in a closed position. Rotating the lever arm 156 to the closed position causes the pin 160 to move to an opposite end of the arc shaped opening 166 and thereby move the pivot arm 154 and one of the guide rails 120B. The lever arm 156 and pivot arm 154 can be located one side or both sides of the cage 101D. Alternatively, an additional cam 164 on an opposite side of the lever arm 156 can be coupled to the cam 164 of the lever arm 156 can cause a force to be applied to both guide rails 120B.

The lever arm 156 can be held in closed position by a number of means. A catch on the cage 101D may be used into which a portion of the lever arm is moved into. Alternatively, a spring mechanism may be used to apply force to keep the lever arm in the closed position and require force to bring it into the open condition. Alternatively, a friction mechanism or a cam mechanism may be applied to the end of the lever arm near its pivot point 162 to deter movement in the lever arm and hold it in the closed position.

While the lever system 150 has been described as moving the guide rails 120B, a lever system may be similarly used to move the guide tabs 144 illustrated in FIGS. 1E–1G. With guide slots of the fiber optic module engaged therein, it can be moved to compress an interposer and form an electrical connection to pads of a host PCB.

Another retention mechanism that may be used is release levers on the fiber optic modules with respective latches as part of the module receptacle or cage. The release levers may be located one or both of the sides, the top, or the base of the fiber optic module. The respective latches may be located on one or both of the sides, the top or the base of the module receptacle or cage.

Figure 1L:
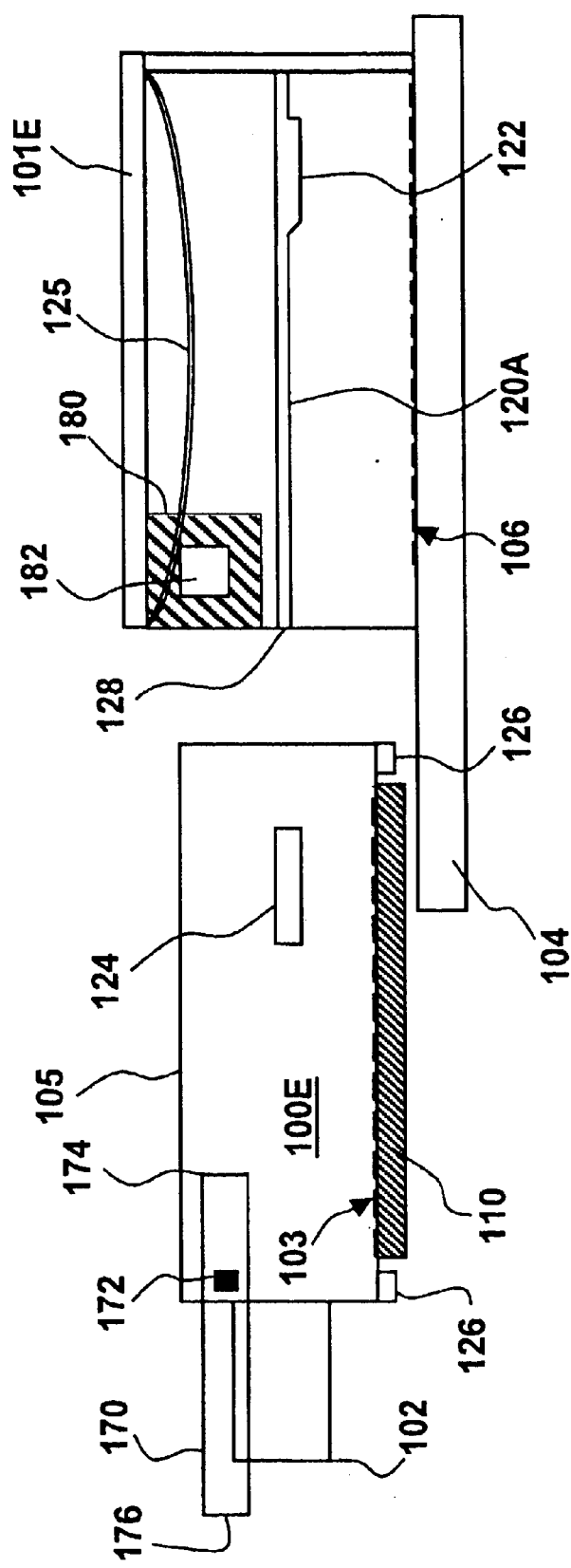
FIG. 1L is a side cutaway view of an alternate embodiment of the fiber optic transceiver module of FIG. 1A disengaged from a module receptacle.
Figure 1N:
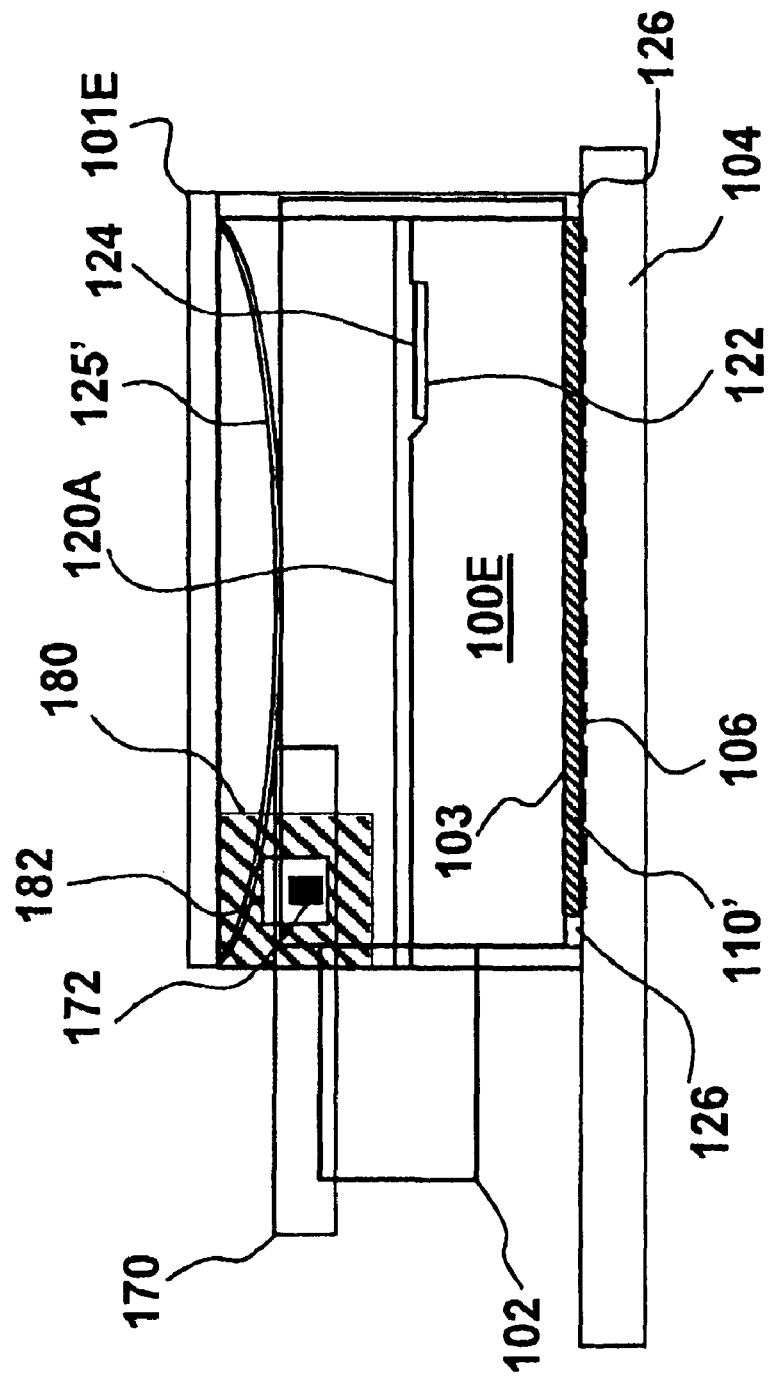
FIG. 1N is a side cutaway view of the fiber optic transceiver module of FIG. 1L engaged with the module receptacle.
Figure 10:
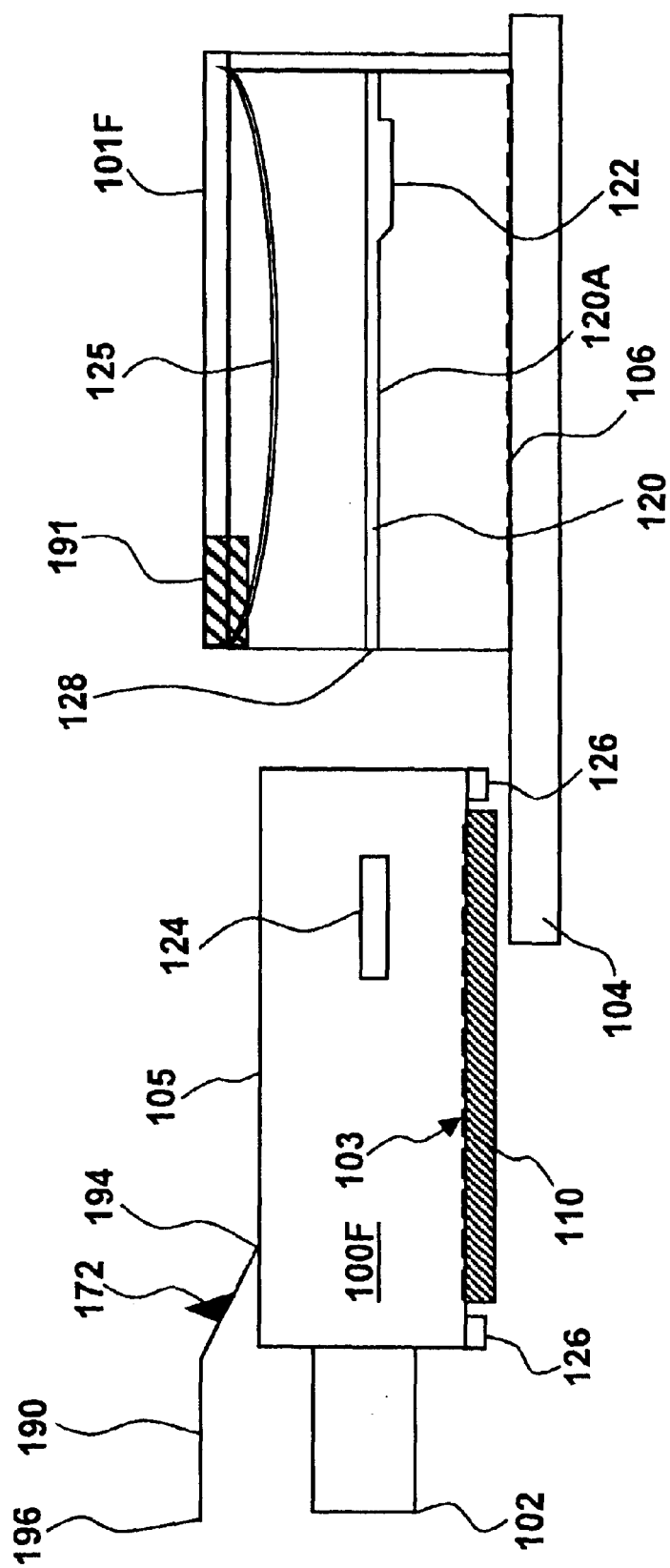

Referring now to FIGS. 1L–1N, another embodiment of the invention is disclosed in detail. In this embodiment, the fiber optic module includes one or more release levers at its sides and the cage or receptacle includes a latch to which the release lever may engage. In FIG. 1L, the fiber optic module 100E is illustrated as being ejected or disengaged from the cage or module receptacle 101E. The fiber optic module 100E includes one or a pair of release levers 170 on each side of the housing or cover 105 of the fiber optic module 100E. The cage or receptacle 101E includes one or a pair of latches 180 to engage with the respective release levers 170. The latches 180 are one or both sides of the cage or receptacle 101E. Other elements of the embodiment of the fiber optic module 100E and cage 101E are somewhat similar to the embodiments of the fiber optic module 100A and cage 101A with like elements having the same reference numbers.

Each release lever 170 includes a catch 172 to engage an opening 182 in the latch 180 when the fiber optic module 100E is inserted into the cage or receptacle 10E. Each release lever 170 may be coupled to the fiber optic module at a point 174 along the side. Each release lever 170 may be formed integral with the side or separately coupled thereto extending outward from the side to form a lever and sweeping back along each side towards a press point 176. When the fiber optic module 100E is engaged into the cage 10E, each lever 170 has its press points 176 extending sufficiently beyond the cage so that it can be pressed or squeezed by a user to lever each catch 172 out of the respective opening 182 in the latch 180 in order to release and pull out the fiber optic module from the cage.

FIG. 1M illustrates a top view of the fiber optic module 100E disengaged from the cage 101E. The guides or guide tabs 124 are shown extending from each respective side of the fiber optic module 100E. The latches 180 are shown nearer the front opening 128 in the sides of the cage 101E to mate with the catches 172 of the release levers 170. Each of the guide rails 120A to each side of the cage 101E include a slot, shelf, or edge 185 over which the guide tabs 124 can slidingly engage in order to guide the fiber optic module 100E into the cage 101E.

FIG. 1N illustrates a side cutaway view of the fiber optic module 100E engaged within the cage 101E. As illustrated, the catch 172 of the release lever 170 is coupled into the opening 182 of the latch 180 to retain the fiber optic module 100E in the cage 101E. Additionally, the guide or guide tabs 124 are engaged with the guide stop 122 so that the compressed spring 125' can force the fiber optic module toward the host PCB 104 and make electrical connections through the compressed elastomer or interposer 110'.

Figure 1P:
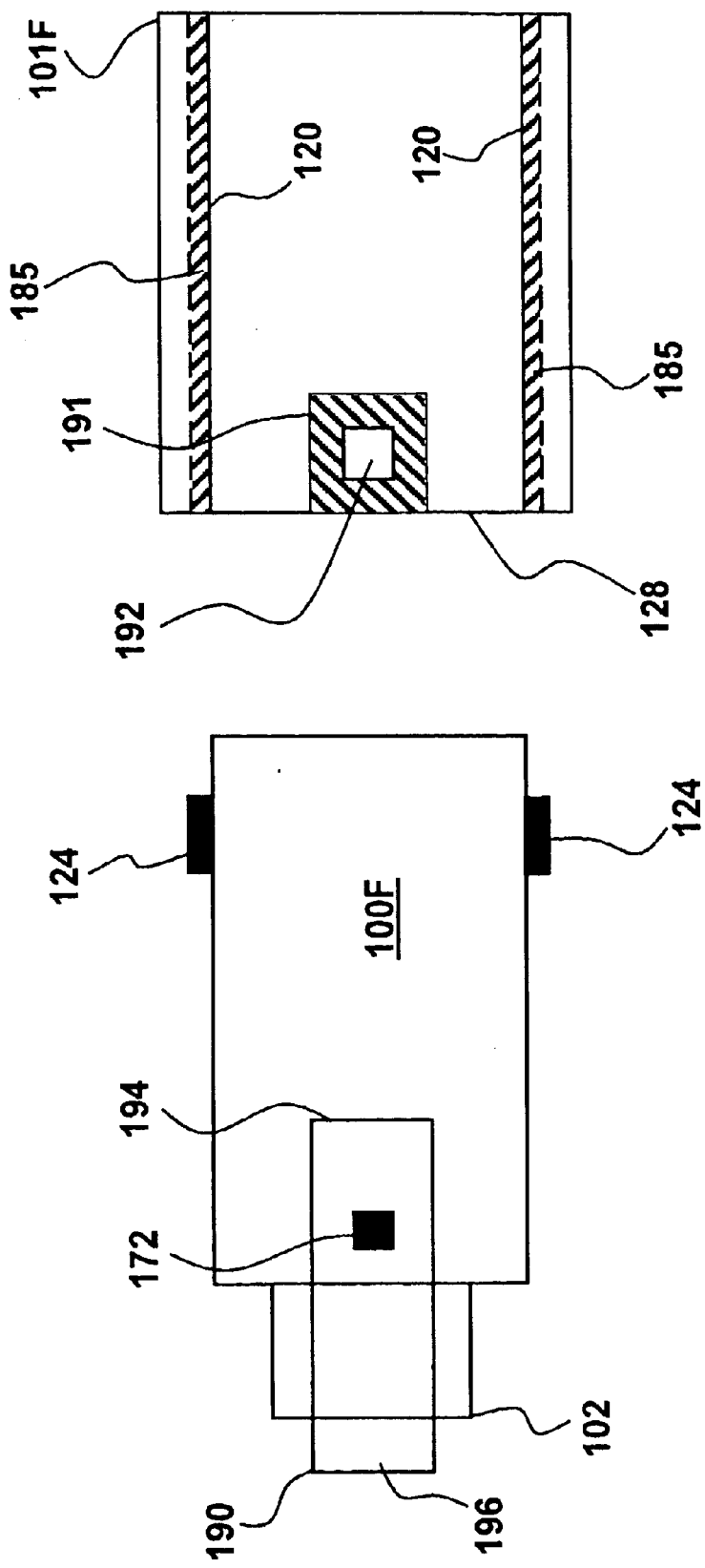
FIG. 1P is a top view of the fiber optic transceiver module of FIG. 1O disengaged from the module receptacle.

Referring now to FIGS. 1O–1P, another embodiment of the invention is disclosed in detail. In this embodiment, the fiber optic module includes a release lever at its at top side and the cage or receptacle includes a latch to which the release lever may engage. In FIG. 1O, the fiber optic module 100F is illustrated as being ejected or disengaged from the cage or module receptacle 101F. The fiber optic module 100F includes a release lever 190 on top of the housing or cover 105 of the fiber optic module 100F. The cage or receptacle 101F includes a latch 191 to engage with the respective release lever 190. The latches 191 is coupled to the top of the cage or receptacle 101F. Other elements of the embodiment of the fiber optic module 100F and cage 101F are somewhat similar to the embodiments of the fiber optic module 100A and cage 101A with like elements having the same reference numbers.

The release lever 190 includes the catch 172 to engage an opening in the latch 191 when the fiber optic module 100F is inserted into the cage or receptacle 101F. The release lever 190 may be coupled to the fiber optic module at a point 194 at the top of the housing or cover 105. The release lever 190 may be formed integral with the top of the cover 105 or separately coupled thereto extending outward from the top to form a lever and sweeping back along the top towards a press point 196. When the fiber optic module 100F is engaged into the cage 101F, the press points 196 extends sufficiently beyond the cage so that it can be pressed or squeezed by a user to lever each catch 172 out of the respective opening in the latch 191 in order to release and pull out the fiber optic module from the cage.

FIG. 1P illustrates a top view of the fiber optic module 100F disengaged from the cage 101F. The guides or guide tabs 124 are shown extending from each respective side of the fiber optic module 100F. The latch 190 is shown nearer the front opening 128 in the top of the cage 101E to mate with the catch 172 of the release lever 190. Each of the guide rails 120A to each side of the cage 101E include a slot, shelf, or edge 185 over which the guide tabs 124 can slidingly engage in order to guide the fiber optic module 100F into the cage 101F.

The catch 172 of the release lever 190 couples into the opening 192 of the latch 190 to retain the fiber optic module 100F in the cage 101F when its engaged therein. Additionally, the guide or guide tabs 124 engage with the guide stop 122 so that the compressed spring 125' can force the fiber optic module toward the host PCB 104 and make electrical connections through the compressed elastomer or interposer 110'.

In another alternate embodiment, the fiber optic module 100F and cage 101F can be altered to provide hot pluggability such as through the ground pin 130A and power pin 131A and sockets 130B and 131B or extended power and ground pads as previously discussed and which is further discussed below. Otherwise, the electrical connections are formed similarly to that discussed with reference to the fiber optic module 100A and the cage 101A.

In yet another alternate embodiment, the release lever 190 and the latch 191 may be located in the respective bases (bottoms) of the fiber optic module 100F and the cage 101F instead of their tops as illustrated in FIGS. 1O–1P. This would preferably place the fiber optic module and cage near an edge of the host PCB 104.

Figure 2B:
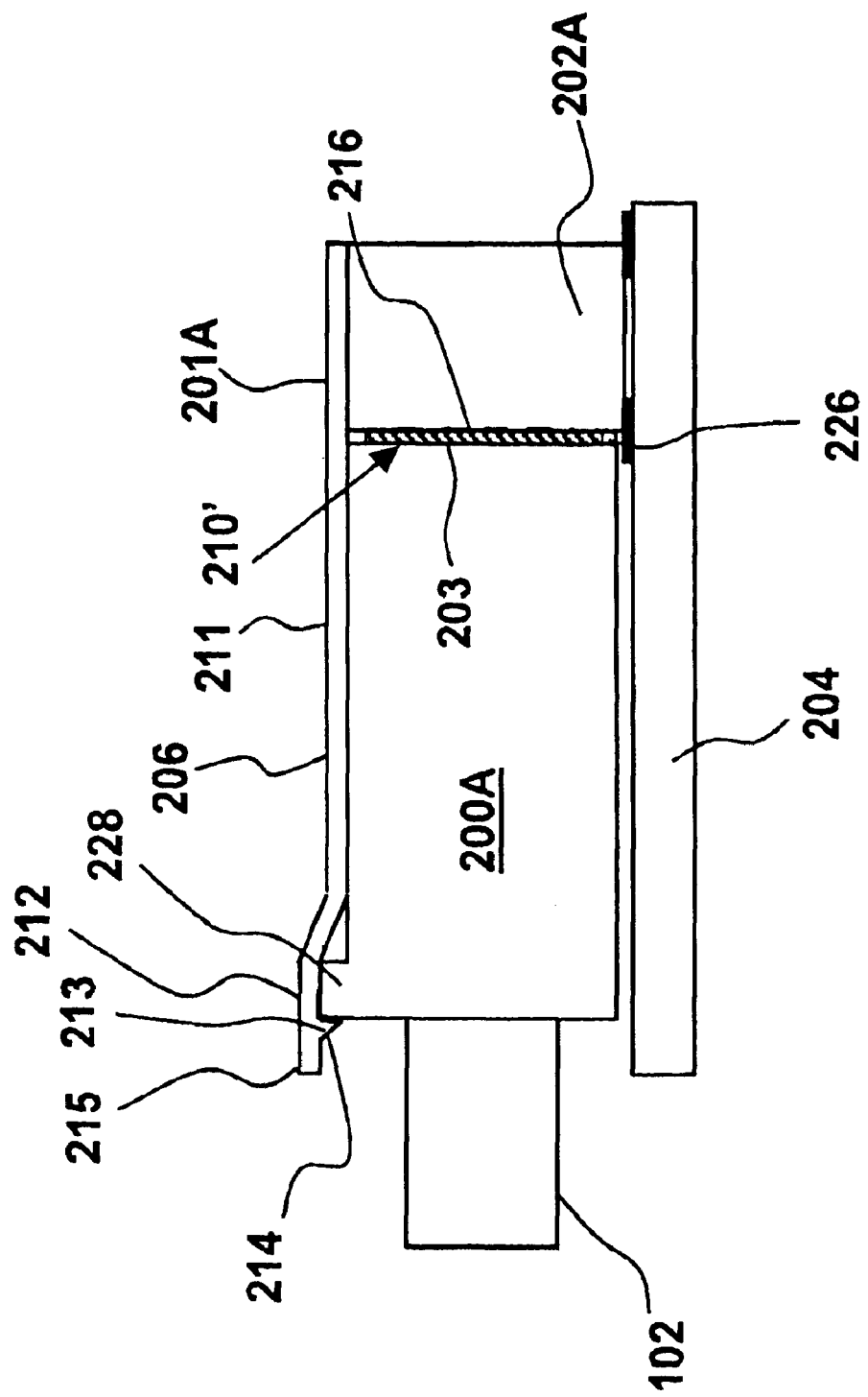
FIG. 2B is a side view of the fiber optic transceiver module of FIG. 2A engaged in the module receptacle.

Referring now to FIGS. 2A–2B, another embodiment of the invention is disclosed. FIG. 2A is a side view of a fiber optic transceiver module 200A disengaged from a host guide system, module receptacle or cage 201A including a connector 202A. The fiber optic module 200A makes an inline connection to the connector 202A. The connector 202A is coupled to the host PCB 204. This embodiment includes the fiber optic transceiver module 200A and host guide system or module receptacle 201A which includes the connector 202A and a retention mechanism 206. At the front side of the fiber optic transceiver module 200A is a fiber optic connector 102. The fiber optic module 200A has an array of contacts 203 at an end opposite the fiber connection interface of the fiber optic connector 102. An interposer or elastomer 210 is loosely coupled to the fiber optic module 200A near its contacts 203 at the end opposite the fiber optic connector 102.

The retention mechanism 206 may couple to the connector 202A at one end or alternatively the host PCB 204 at the one end. The retention mechanism 206 has a middle region or arm 211 and a spring latch 212 at an opposite end. The spring latch 212 has a catch 213 with a sloped leading edge 214 on one side and a perpendicular edge on an opposite side. The spring latch 212 may further have a finger release tab 215 which extends beyond the sloped leading edge 214 of the catch 213 to allow a user's finger to push up or out from a fiber optic module and release the catch 213. The retention mechanism may also be referred to as a release lever, a cage, or a receptacle for fiber optic modules. Alternatively, the retention mechanism may be a part of a cage, a receptacle, or a housing to receive fiber optic modules.

The middle region or arm 211 of the retention mechanism 206 allows it to act like a lever arm or spring arm to retain and allow release of a fiber optic module. Additionally, the length of the middle region 211 between the catch 213 and the opposite end of the retention mechanism provides for the electrical coupling of contacts of the fiber optic module with electrical contacts of the connector 202A. Furthermore, the length of the middle region 211 may assure proper compression of the elastomer 210. The components of retention mechanism 206 are solid members such as metal or plastic to provide a spring like force and may be integrally formed together. The retention mechanism 206 may also be conductive and coupled to ground traces of the host PCB so as to shunt electrostatic charges to ground and reduce RF and electromagnetic interference from the fiber optic module.

The connector 202A in one embodiment is a surface mount technology (SMT) connector to make a surface mount connection to the system or host PCB 204. The connector 202A includes contacts or pads 216 which are to be electrically connected to the system or host PCB 204.

The fiber optic module 200A further includes a compression stop 226 on a back side to prevent over compression of the interposer 210. The compression stop 226 is a solid which is hard and substantially non-compressible. The compression stop 226 can couple to a surface of the connector 202A in order to avoid over-compression of the interposer 210.

The fiber optic module 200A further includes a retention stop 228 on a top side to mate with the spring latch 212 of the retention mechanism 206 and hold the fiber optic module 200A in place such that the interposer or elastomer 210 is compressed.

Referring now to FIGS. 2A–2B, the back side of the parallel fiber optic module 200A is first inserted between the retention mechanism 206 and the host PCB 204 of the cage or module receptacle 201A. The top surface of the fiber optic module 200A flexes the retention mechanism 206 until the retention stop 228 meets the spring latch 212. The retention stop 228 rides up the sloped leading edge 214 of the catch 213 of the spring latch 212 causing the retention mechanism to flex further. After the retention stop 228 passes the sloped leading edge 214 of the catch 213, the spring latch 212 snaps downward, capturing the fiber optic module 200A into place as illustrated in FIG. 2B. With the fiber optic module 200A snapped into place and the spring latch 212 engaging the retention stop 228, the elastomer is compressed between the contacts of the fiber optic module 200A and the contacts of the connector 202A. The ground pin and power pin may sequentially contact the system board or host printed circuit board through the connector 202A to provide for hot pluggability as will be discussed further. The host pads or contacts 216 of the connector 202A align with the module pads or contacts 203 and electrically coupled together through the compressed elastomer 210'.

The spring latch 212 provides a positive force to keep the elastomer compressed in order to make an electrical connection between the contacts of the fiber optic module 200A and the contacts of the connector 202A. The compression stop 226 is adjacent to the elastomer 210 in order to prevent over compression of it.

To disengage the fiber optic module from the cage or receptacle system, the spring latch 212 can be lifted up at the finger release tab 215 so the catch 213 clears the retention stop 228 and the compression force of the elastomer 210 can push put the fiber optic module 200A.

Figure 2C:
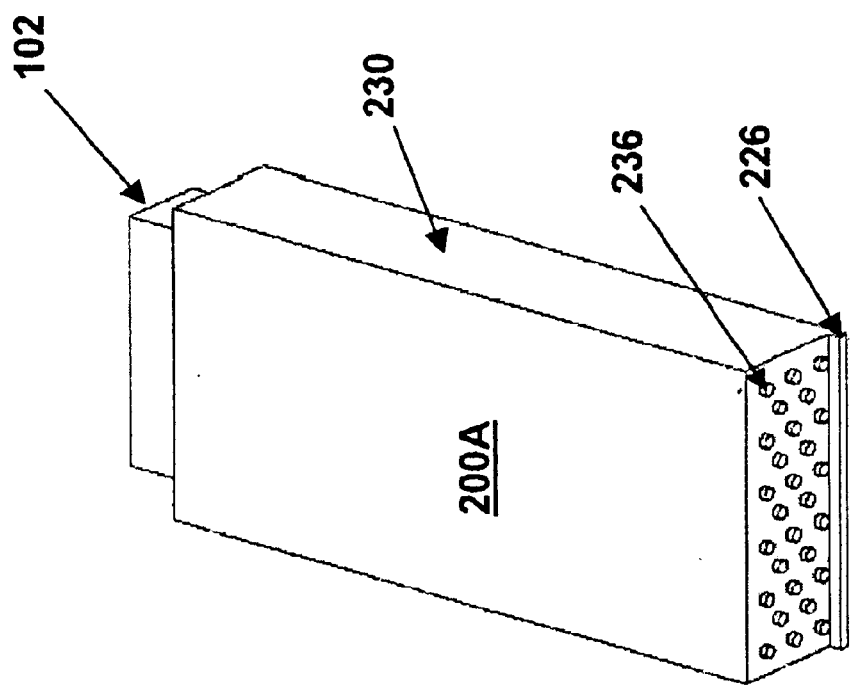
FIG. 2C is a top back side perspective view of the fiber optic transceiver module of FIG. 2A.

Referring now to FIG. 2C, a top back side perspective view of the fiber optic transceiver module 200A is illustrated. The fiber optic module 200A includes a body or housing 230, signal contacts 236, the compression stop 226 and the fiber optic connector 102. The fiber optic module 200A further includes one or more electro-optic transducers to convert optical signals into electrical signals or electrical signals into optical signals. The signal contacts 236 are for coupling data signals into and receiving data signals from the one or more electro-optic transducers. The contacts 236 are arranged into rows and columns of a two-dimensional array of contacts or pin-outs at a back side of the fiber optic module 200A. Connection density is increased by the use of the two dimensional connector as opposed to a one dimensional connector having a single row or a single column of contacts.

Figure 2D:
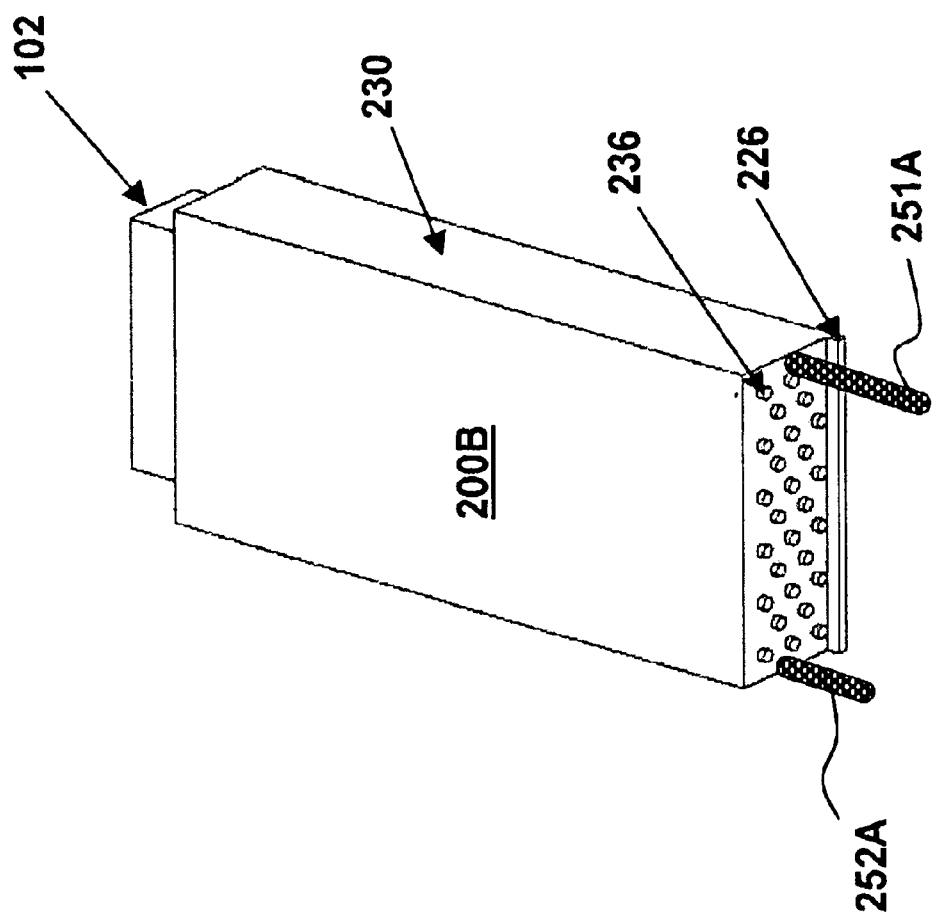
FIG. 2D is a top back side perspective view of an alternate embodiment of the fiber optic transceiver module of FIG. 2C.
Figure 2E:
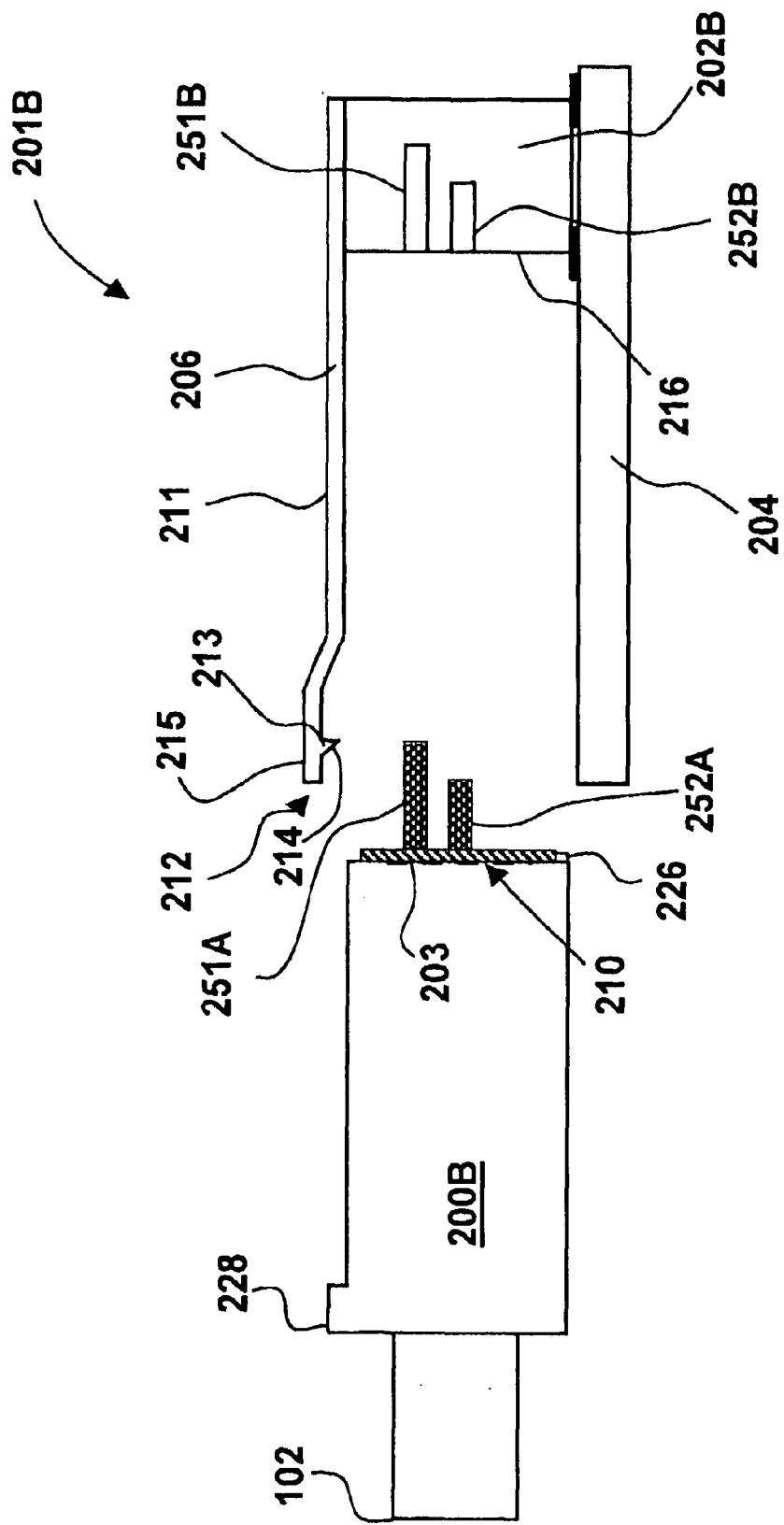
FIG. 2E is a side view of the alternate embodiment of the fiber optic transceiver module of FIG. 2D disengaged from a module receptacle.
Figure 2F:
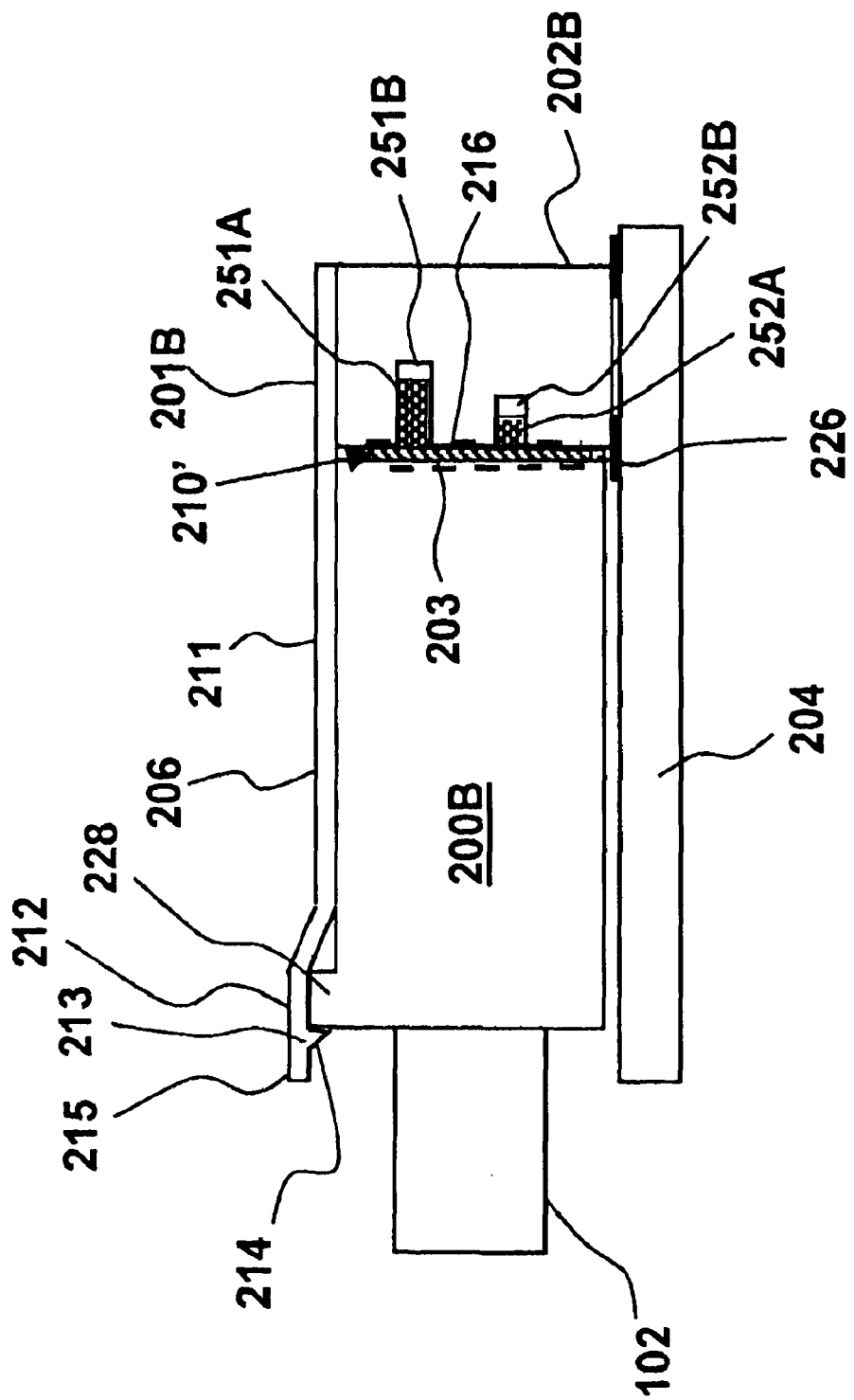
FIG. 2F is a side view of the fiber optic module of FIG. 2E engaged in the module receptacle.

FIGS. 2D–2F illustrate an alternate embodiment to that of FIGS. 2A–2C. The alternate embodiment disclosed in FIGS. 2D–2F includes elements to provide sequencing of electrical connections and hot pluggability of a fiber optic module into a host system.

Referring now to FIG. 2D, power sequencing can be achieved by using elongated pins at the back of the fiber optic module which protrude through the elastomer or are outside of it. In this case, the elongated pins can make contact with sockets at the back of the cage or module receptacle. In FIG. 2D, a protruding ground pin 251A and a protruding power pin 252A are included in the fiber optic module 200B which can be sequentially engaged in the electrical connection made with the host system.

Referring now to FIG. 2E, the ground pin 251A first engages the ground socket 251B of connector 202B. The power pin 252A then engages the power socket 252B of connector 202B. After the ground pin 251A and the power pin 252A have become engaged into their respective sockets, the other module signal contacts 203 of the fiber optical module 200B engage the connector contacts 216 through the elastomer 210.

FIG. 2F illustrates the fiber optic module 200B plugged into the cage or module receptacle 201B with the elastomer 210' compressed so that signal connections are formed. When the fiber optic module 200B is removed from the cage or module receptacle 201B, the sequence of electrical connections is reversed. The module signal contacts 203 of the fiber optic module 200B are first disconnected. The power pin 252A is then disengaged from the power socket 252B. Then the ground pin 251A is then disengaged from the ground socket 251B. In this manner, the fiber optic module 200B can be hot swapped, leaving the signals, power, and ground live at the connector 202B without powering down the host system.

Other elements of the embodiment of the fiber optic module 200B and cage or module receptacle 201B are somewhat similar to the embodiments of the fiber optic module 200A and cage or module receptacle 201A with like elements having the same reference numbers. The discussion of such like elements are not repeated here for brevity.

Figure 2G:
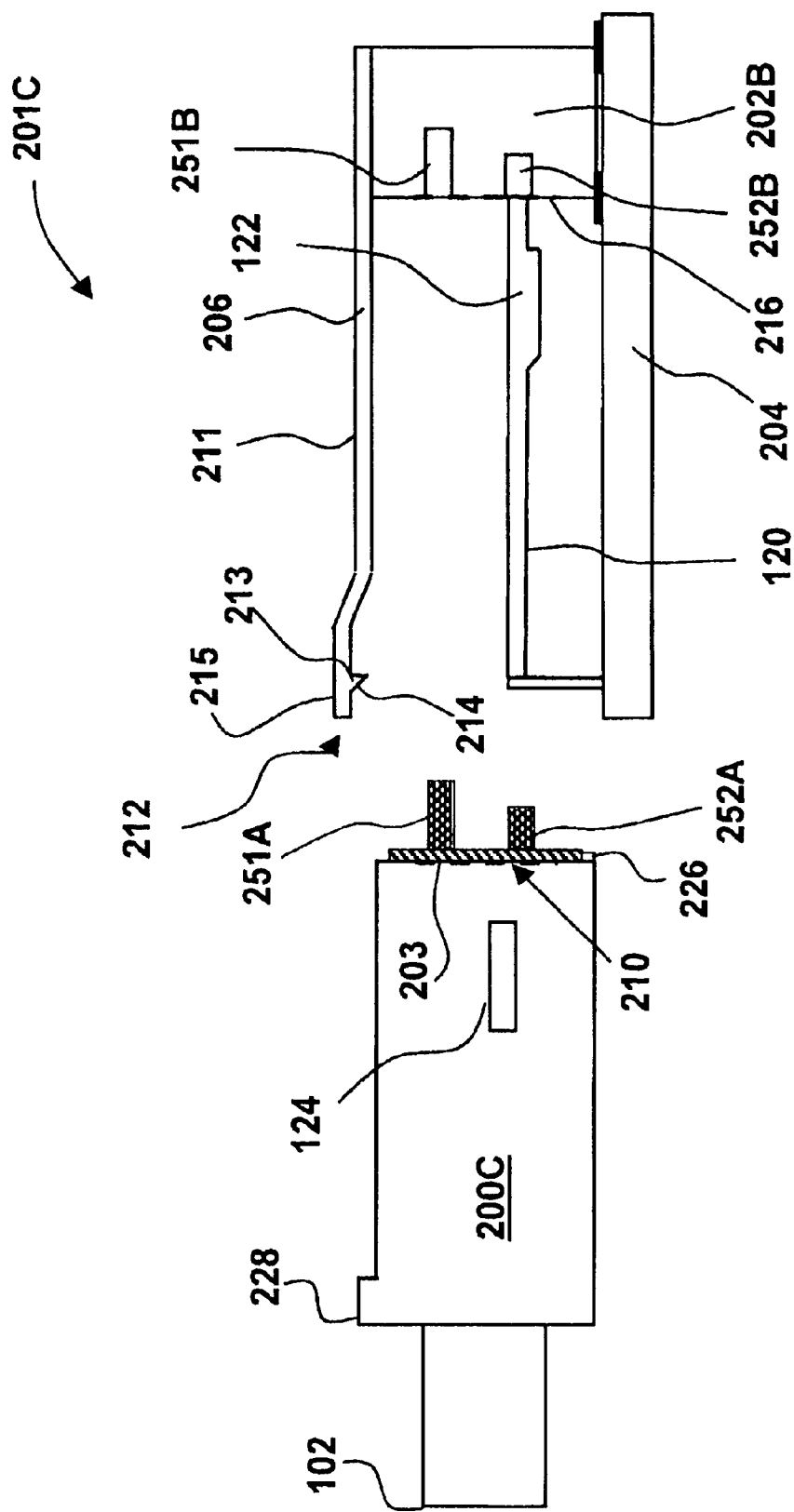
FIG. 2G is a side view of an alternate embodiment of the fiber optic transceiver module of FIG. 2E disengaged from a module receptacle.
Figure 2H:
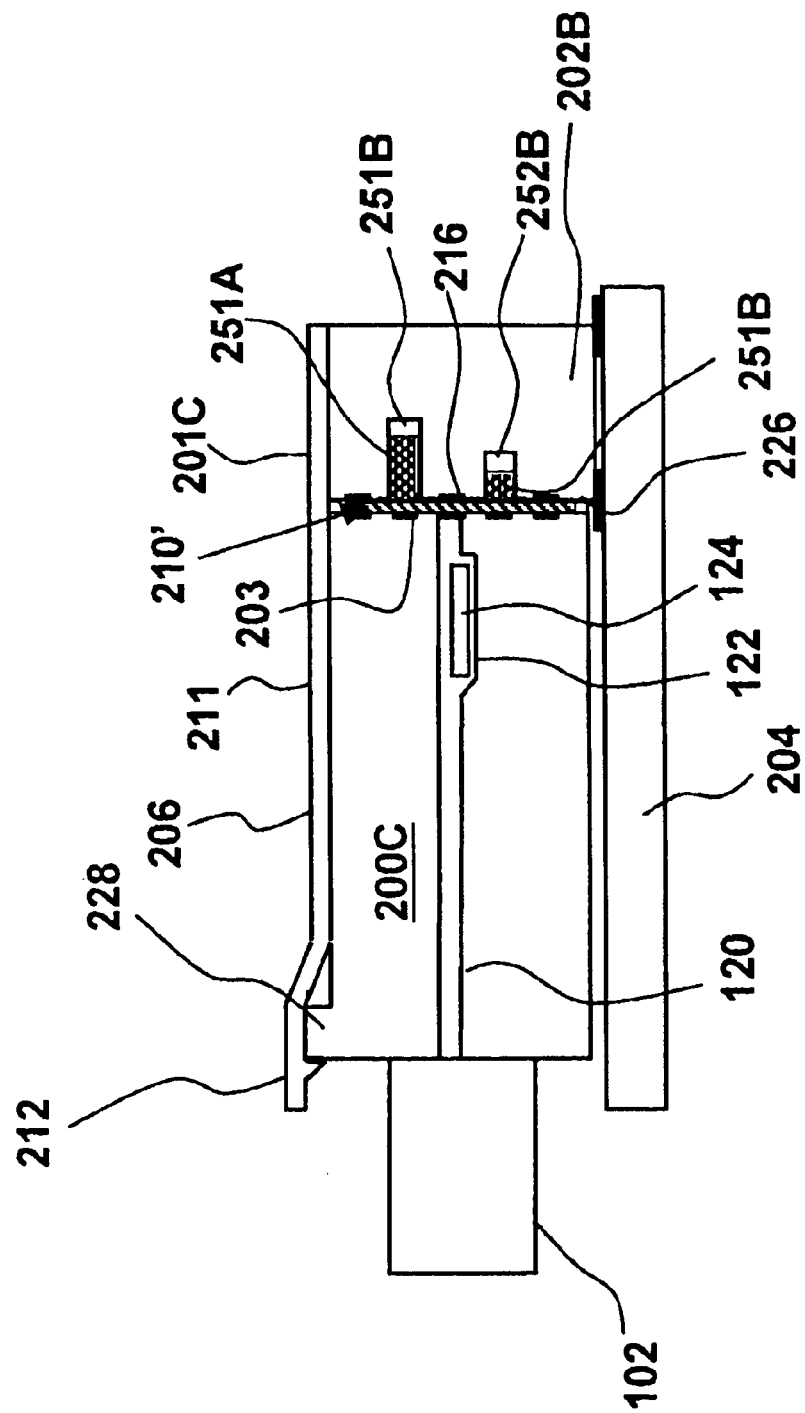
FIG. 2H is a side view of the fiber optic module of FIG. 2G engaged in the module receptacle.

Referring now to FIGS. 2G–2H, yet another alternate embodiment of the fiber optic module 200A is illustrated.

FIGS. 2G–2H illustrate an embodiment which includes the elements of the fiber optic module 200B with the guide tab 124 of the fiber optic module 100A and elements of the cage or module receptacle 201B with the guide rails 120A and cage stop 122 of the cage or module receptacle 101A. FIG. 2G illustrates the fiber optic module 200C ejected from the cage or module receptacle 201C. FIG. 2H illustrates the fiber optic module 200C inserted into the cage or module receptacle 201C. The fiber optic module 200C further includes the guide tab 124 over that of the fiber optic module 200B. The cage or module receptacle 201C further includes the guide rails 120A and the cage stop 122 over that of the cage or module receptacle 201B. Other elements of the embodiment of the fiber optic module 200C and cage or module receptacle 201C are somewhat similar to the embodiments of the fiber optic module 200B and cage or module receptacle 201B with like elements having the same reference numbers.

Figure 2I:
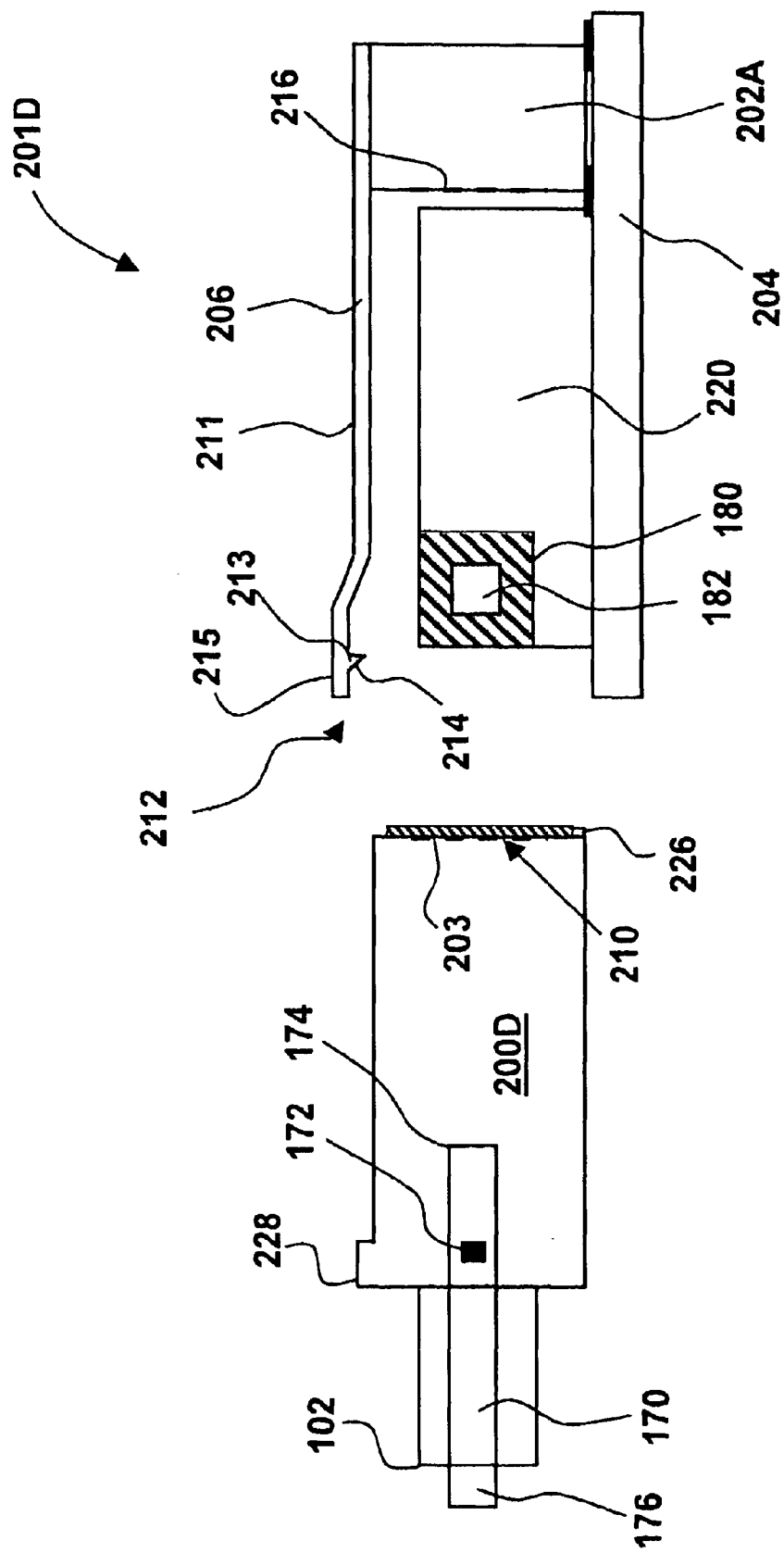
FIG. 2I is a side view of an alternate embodiment of the fiber optic transceiver module of FIG. 2A disengaged from a module receptacle.
Figure 2J:
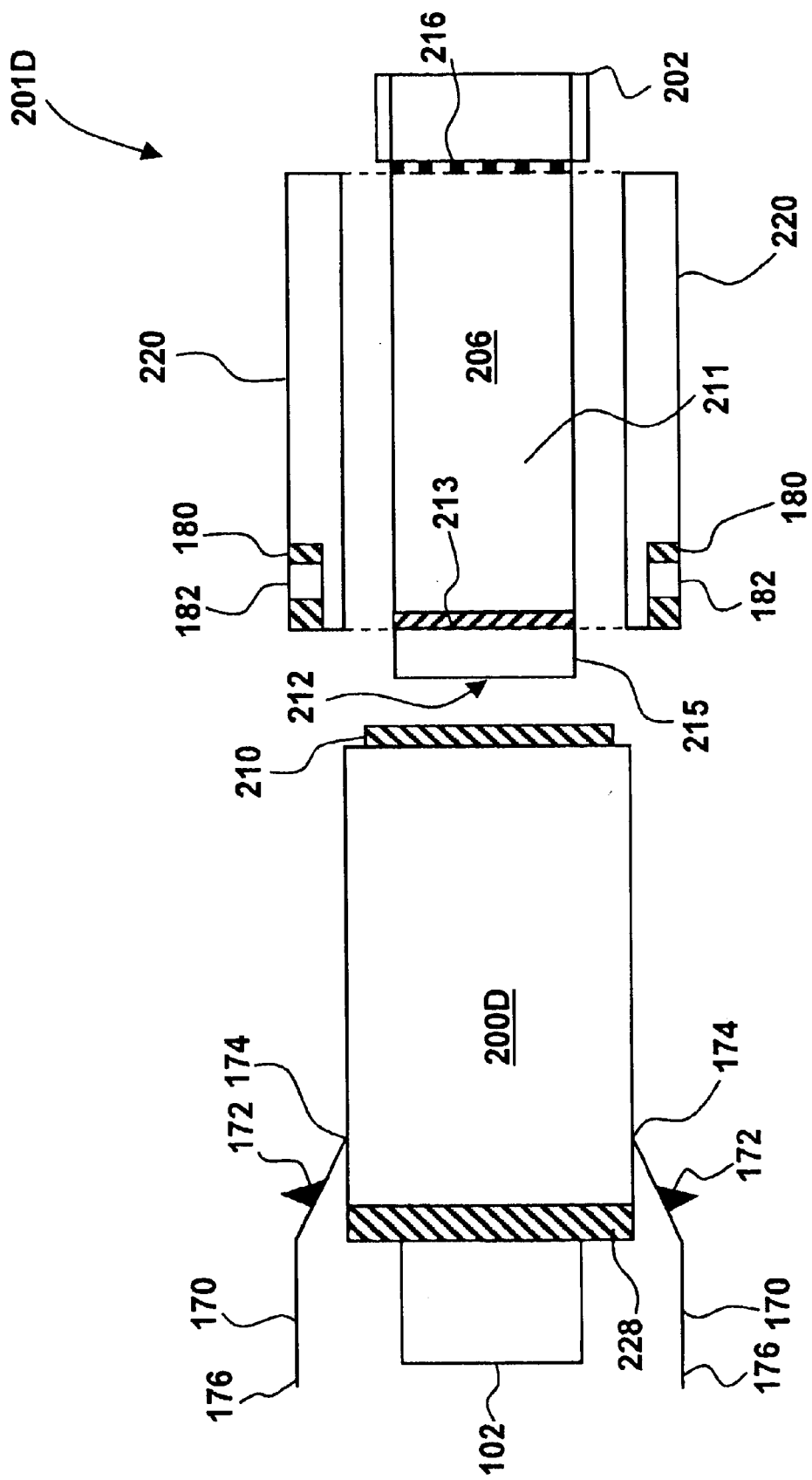
FIG. 2J is a top view of the fiber optic module of FIG. 2I disengaged in the module receptacle.

Referring now to FIGS. 2I–2J, yet another alternate embodiment of the fiber optic module 200A is illustrated. FIGS. 2I–2J illustrate an embodiment where the fiber optic module 200D includes release levers 170 and the cage or receptacle 201D includes latches 180 to respectively engage the release levers. FIG. 2I illustrates the fiber optic module 200D ejected from the cage or module receptacle 201D. FIG. 2J illustrates the fiber optic module 200D inserted into the cage or module receptacle 201D. The elements, functionality, and operation of the release levers and 170 and latches 180 was previously described with reference to Figures L–N and is not repeated here for brevity. The latches 180 are positioned in the sides 220 of the cage or module receptacle 201D.

Referring now to FIG. 2J, a top view of the fiber optic module 200D and the cage or module receptacle 201D are illustrated. A top view of the retention mechanism 206 better illustrates the elements of the catch 213 and finger release tab 215 of the spring latch 212. The width of the retention mechanism 206 can vary while its length is dimensioned so as to appropriately hold the fiber optic module against the connector 202A in order to maintain electrical connections. The latches 180 are illustrated in the guide sides 220 including the openings 182 in each. The guide sides 220 guide the sides of the fiber optic module 200D into the cage, receptacle 201D. The electrical connector 202A includes the pads or contacts 216.

Other elements of the embodiment of the fiber optic module 200D and cage 201D are somewhat similar to the embodiments of the fiber optic module 200A and cage 201A with like elements having the same reference numbers. The discussion of such like elements are not repeated here for brevity.

In another alternate embodiment, the fiber optic module 200D and cage 201D can be altered to provide hot pluggability such as through the ground pin 250A and power pin 251A and sockets 250B and 251B or extended power and ground pads as previously discussed and which is further discussed below. Otherwise, the electrical connections are formed similarly to that discussed with reference to the fiber optic module 200A and the cage 201A.

Figure 3A:
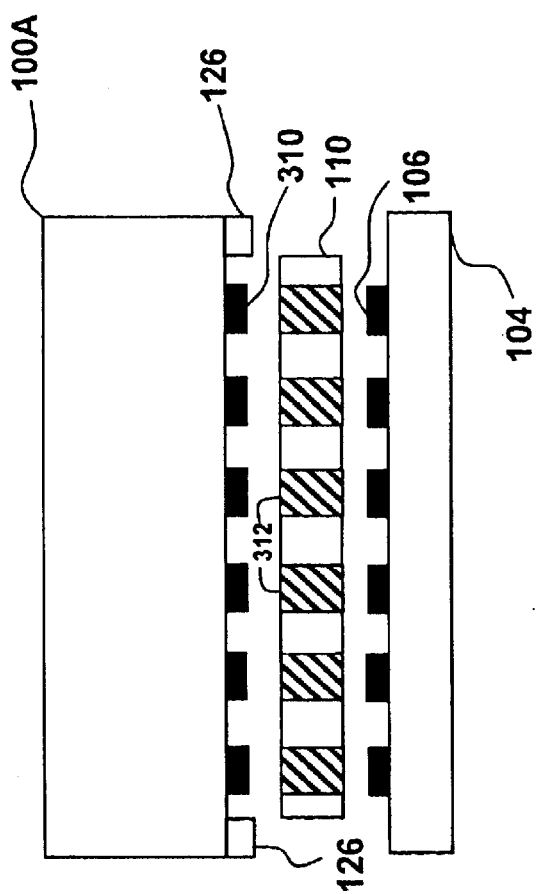
FIG. 3A is an exploded cross-sectional side view of an uncompressed state of a first elastomer between fiber optic transceiver module contacts and host printed circuit board contacts of the host printed circuit board.
Figure 3B:
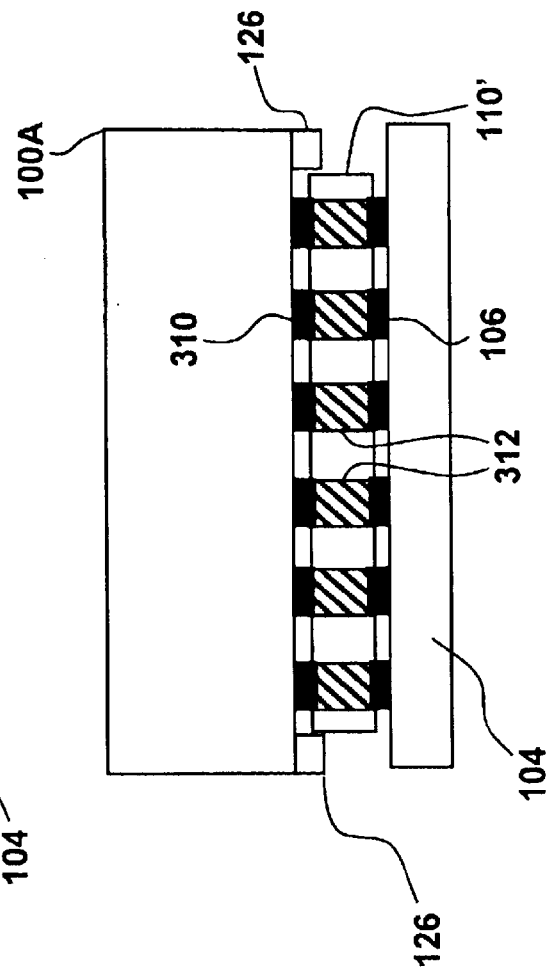
FIG. 3B is an exploded cross-sectional side view of a compressed state of the first elastomer between fiber optic transceiver module contacts and host printed circuit board contacts of the host printed circuit board.

Referring now to FIGS. 3A–3B, an exploded cross-sectional side view of the first elastomer 110 between fiber optic transceiver module contacts 310 of the fiber optic module 100A and the host printed circuit board contacts 106 of the host PCB 104. The contacts may also be referred to as pads. FIGS. 3A and 3B correspond to the embodiment disclosed in FIGS. 1A and 1B. The first elastomer 110 is an elastomer with a patterned mat having filled conductive or metal columns 312. The metal columns 312 are spaced apart from one another to avoid shorting out to one another when the elastomer is compressed or uncompressed.

FIG. 3A illustrates an uncompressed elastomer 110. FIG. 3B illustrates a compressed elastomer 110. The conductive or metal columns 312 in the elastomer 110 facilitate the connection between the host PCB contacts 106 and the contacts 310 of the fiber optic module 10A.

Referring now to FIG. 3C–3D, an alternate embodiment of the fiber optic module 100A is illustrated. In this embodiment, mechanical power sequencing is implemented to provide hot-pluggability without circuit damage. In this case, different thickness of module contact pads can be used to provide power sequencing. Alternatively, different thicknesses of host PCB pads can be utilized to provide power sequencing. In either of these cases in the preferred embodiment, the ground pads are made thickest, the power pads the next thickest and the signal pads are thinnest. Due to the compliance of the elastomer, ground electrical contact is made first, power electrical contact is made second and the signal contacts can be made after both power and ground connections have been made. In an alternate embodiment, it may be desirable to have the power connection prior to the ground connection, in which case, the power pads are the thickest and the ground pads are the next thickest with the signal contacts remaining the thinnest pads.

FIGS. 3C–3D are exploded cross sectional side views of the fiber optic module 300 with raised ground contact pads 331, raised power pads 332 and signal pads 333; the host PCB 335; and the first elastomer 336. In FIG. 3C, the fiber optic module 300 is ejected or disengaged from the cage or module receptacle. In FIG. 3D, the fiber optic module 300 is coupled to or engaged with the cage or module receptacle. The raised ground contact pads 331 extend the farthest out from the end of the module and are the highest, tallest or the thickest pads. The raised power contact pads 332 are shorter than the raised ground contact pads 331 but are higher, taller or thicker than the signal pads 333. The ground contact pads 331 first make contact with the elastomer 336 and the host PCB contact pads 334 which are coupled to ground. The power contact pads 332 make contact with the elastomer 336 secondly and the host PCB contact pads 334 which are coupled to power. Lastly, the signal contact pads 333 make contact with the elastomer 336 and the respective host PCB contact pads 334 which are coupled to the parallel data signal lines. The differences in contact pad heights ensure sequential electrical contact of the fiber optic module with the host system PCB. When removing the fiber optic module, the sequencing of electrical contact is reversed with the ground connection being broken last.

While the elastomer connectors 110 and 336 with conductive or metal columns 312 have been described as being respectively used with fiber optic modules 100A and 300 and their retention mechanisms and connectors, if any, for a base electrical connection with a host PCB, they may also be used with fiber optic modules 200, 200B, and 200C and their respective retention mechanisms for an end electrical connection with an electrical connector coupled to the host PCB. In other words, the conductive or metal columns 312 of the elastomer connectors 110 and 336 can be replaced with conductive particles or micro-filaments which are further described below.

Figure 4B:
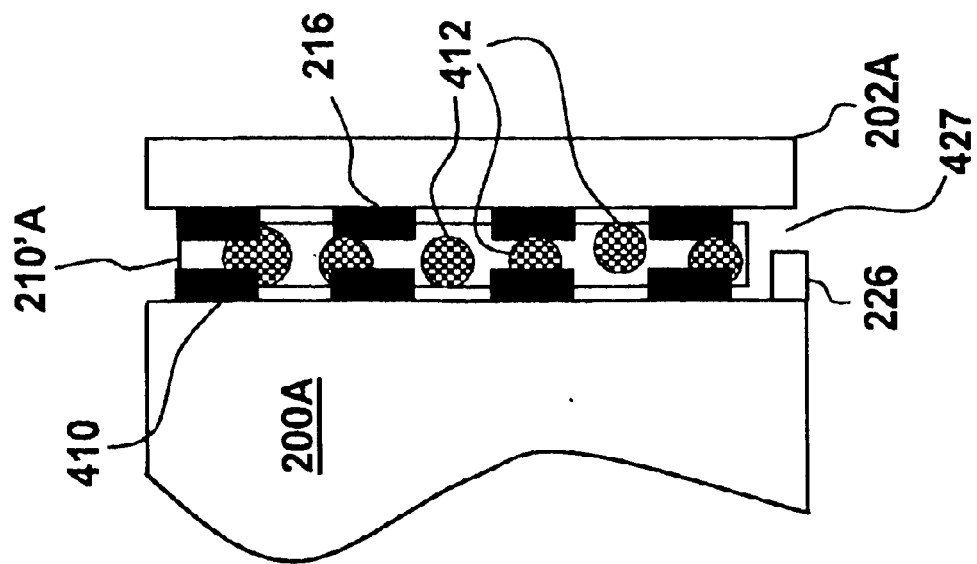
FIG. 4B is an exploded cross-sectional side view of a compressed state of the elastomer of FIG. 4A between fiber optic transceiver module contacts and contacts of the module receptacle.
Figure 4A:
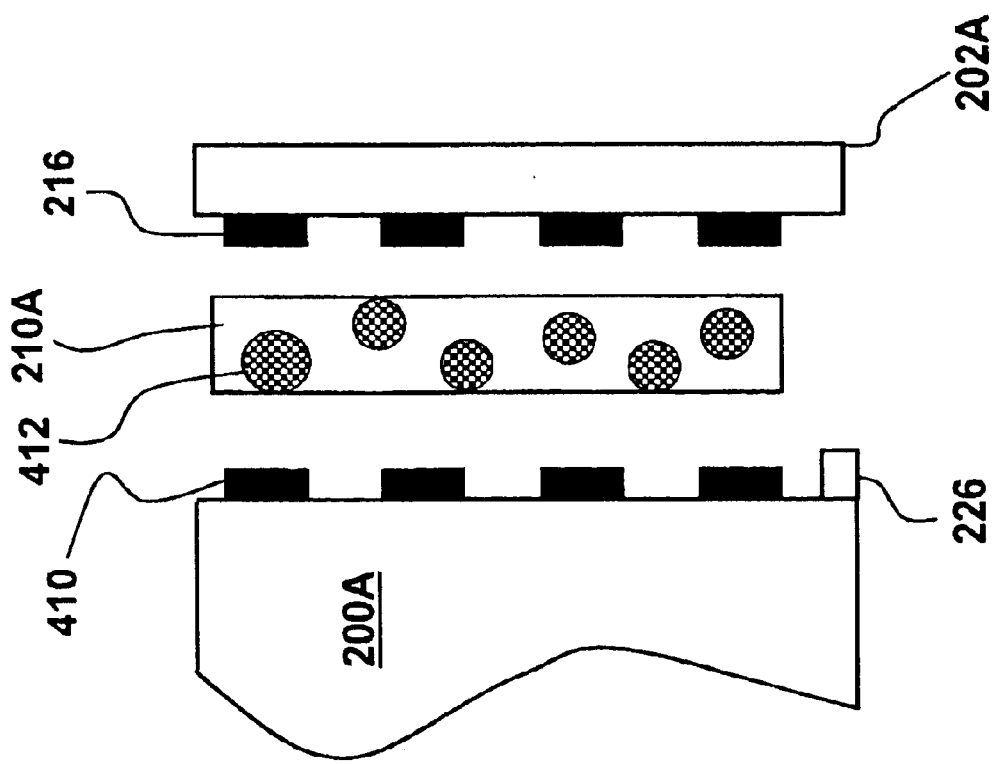
FIG. 4A is an exploded cross-sectional side view of an uncompressed state of an elastomer between fiber optic transceiver module contacts and contacts of the module receptacle.

Referring now to FIGS. 4A–4B, exploded cross-sectional side views of a second elastomer 210 between fiber optic transceiver module contacts 410 of the fiber optic module 200A and connector contacts 216 of the connector 202A. The z-connector/elastomer 210 is an elastomer with densely packed conductive particles or micro-filaments 412 having a pitch smaller than pad size of the connector contacts 216 or the module contacts 410 of the fiber optic module 200A. To establish a connection between the contacts 216 and the contacts 410 of the fiber optic module 200A through the z-connector/interposer 210, appropriate pressure is applied in a z direction to establish the connection. The conductive particles or micro-filaments 412 are spaced apart from one another in the elastomer to avoid shorting out to one another when it is compressed or uncompressed. FIG. 4A illustrates an uncompressed elastomer 210. FIG. 4B illustrates a compressed elastomer 210. The conductive particles or micro-filaments 412 in the elastomer 210 facilitate the connection between the connector contacts 216 and the contacts 410 of the fiber optic module 200A. In FIG. 4B, a gap 427 is present between the compression stop 226 of the fiber optic module 200A and the connector 202A.

Figure 4D:
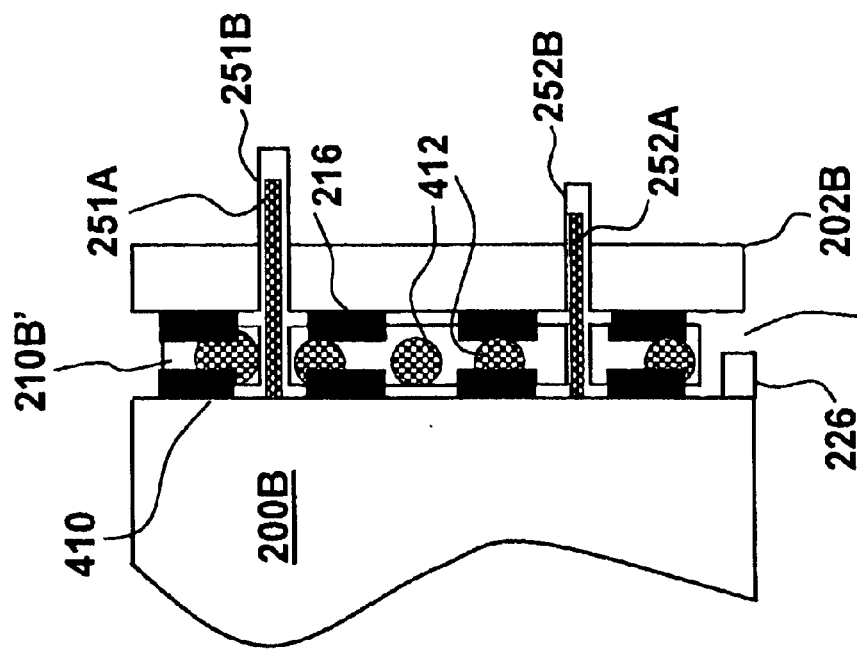
FIG. 4D is an exploded cross-sectional side view of a compressed state of the elastomer of FIG. 4C between fiber optic transceiver module contacts and contacts of the module receptacle.
Figure 4C:
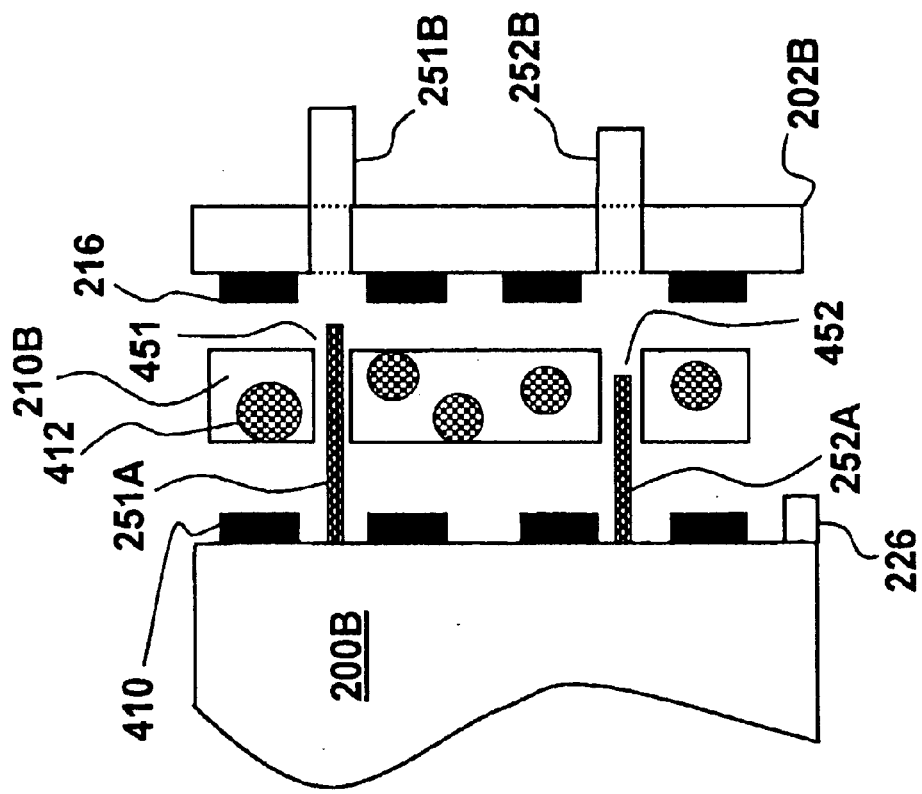
FIG. 4C is an exploded cross-sectional side view of an uncompressed state of an elastomer between fiber optic transceiver module contacts including ground and power pins and contacts of the module receptacle including ground and power sockets.

Referring now to FIGS. 4C–4D, an alternate embodiment of the fiber optic module 200A is illustrated. In this embodiment, mechanical power sequencing is implemented to provide hot-pluggability without circuit damage. FIGS. 4C–4D are magnified cross sectional side views of the fiber optic module 200B with ground pin 251A and power pin 252A which extend beyond the signal pads 410; the connector 202B; and an alternate embodiment of the second elastomer 210'. The second elastomer 210' includes the conductive particles 412 and a pair of openings 451 and 452 to allow the respective pins 251A and 252A to extend through without shorting thereto. The connector 202B includes the ground socket 251B and the power socket 252B. The fiber optic module 200B includes the ground pin 251A and the power pin 252A. FIG. 4C shows a disengaged view of the fiber optic module 200B with the cage or receptacle 201B and an uncompressed elastomer or interposer 210B. FIG. 4D shows an engaged view of the fiber optic module 200B with its respective cage or receptacle 201B and a compressed elastomer or interposer 210B'.

In FIG. 4D, the module signal contacts 410 are electrically coupled to the signal contacts 216 of the electrical connector 202B. The ground pin 251A of the module 200B is electrically coupled to the ground socket 251B. The power pin 252A of the module 200B is electrically coupled to the power socket 252B. The power and ground sockets may be a part of the electrical connector 202B as shown or alternatively separate components from the electrical connector 202B.

While FIGS. 4C–4D illustrate the ground pin 251A and power pin 252A extending through the respective openings 451 and 452 in the elastomer 210', the ground pin 251A and power pin 252A may be located outside of the elastomer 210 in an alternate embodiment such that the openings 451 and 452 are not needed.

While the elastomers 210A and 210B with conductive particles or micro-filaments 412 have been described as being respectively used with fiber optic modules 200A and 200B and their retention mechanisms and connectors for an end electrical connection with an electrical connector coupled to the host PCB, they may also be used with fiber optic modules 100, 100B, and 100C and their respective retention mechanisms and connectors if any, for a base electrical connection with the host PCB. In other words, the conductive particles or micro-filaments 412 of the elastomers 210A and 210B can be replaced with metal columns 312 which are described above. Additionally, the power contact pads, ground contact pads, and signal contact pads can have different heights so that proper power sequencing can be provided with the end connection to the connector 200A similar to that which was described with reference to FIGS. 3C and 3D. The conductive particles or micro-filaments 412 and the conductive or metal columns 312 of the elastomers can be collectively referred to as compressible spaced apart conductors.

Each retention mechanism described herein may be integral with a cage. Alternatively, the retention mechanisms may be a separate component from the cage and only a part of a receiving system for fiber optic modules. In still another embodiment, the retention mechanisms described herein may be part of a housing to receive fiber optic modules. The cages and housings as well as the retention mechanisms may be conductive to shield radio frequency interference or electromagnetic interference, and to dissipate electro-static charges. In order to be conductive, these components may formed for example out of metal or a metalized plastic. The fiber optic modules described herein may be considered to be non-fixed, non-solderable, pluggable, removable, or replaceable types of fiber optic modules.

Figure 5C:
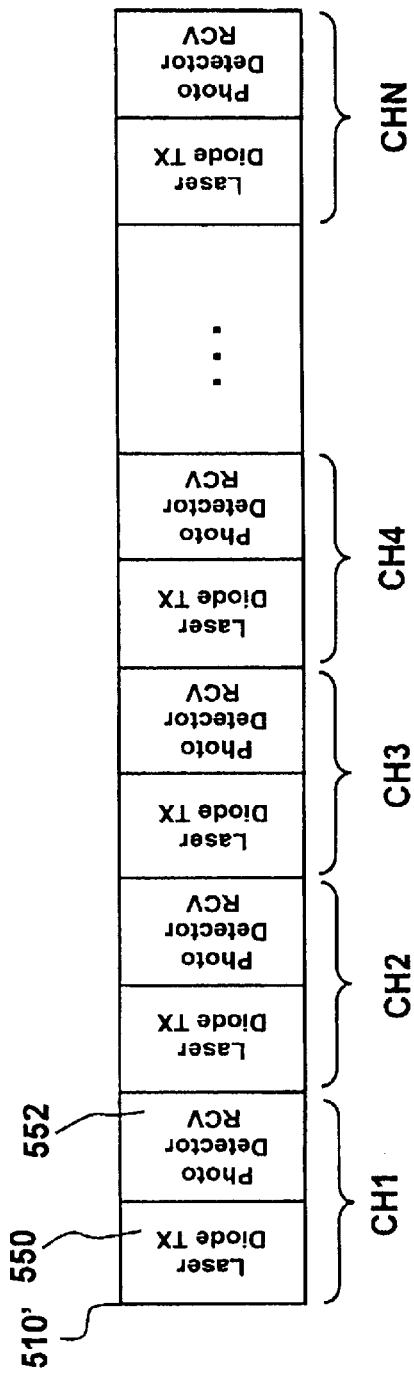
FIG. 5C is a block diagram of a single fiber optic transceiver module to provide N full duplex communication channels.
Figure 5D:
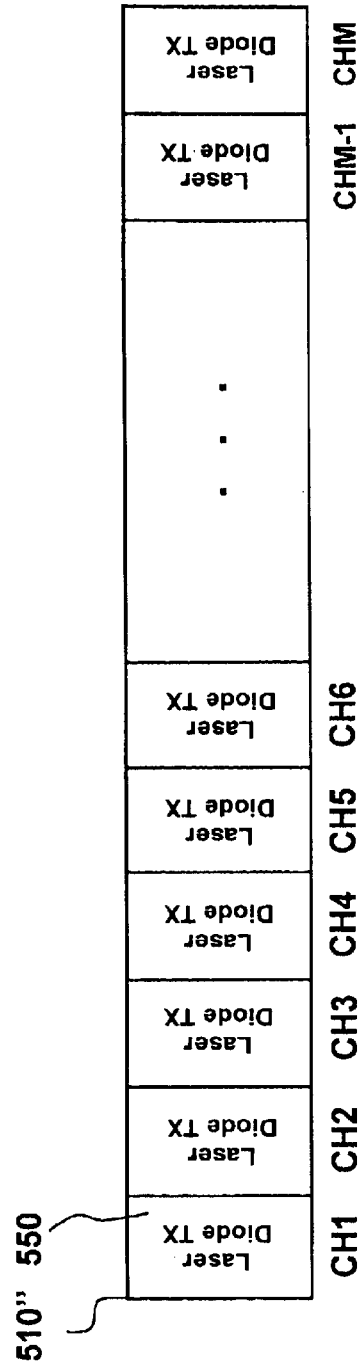
FIG. 5D is a block diagram of a single fiber optic transceiver module to provide M transmit channels.
Figure 5E:
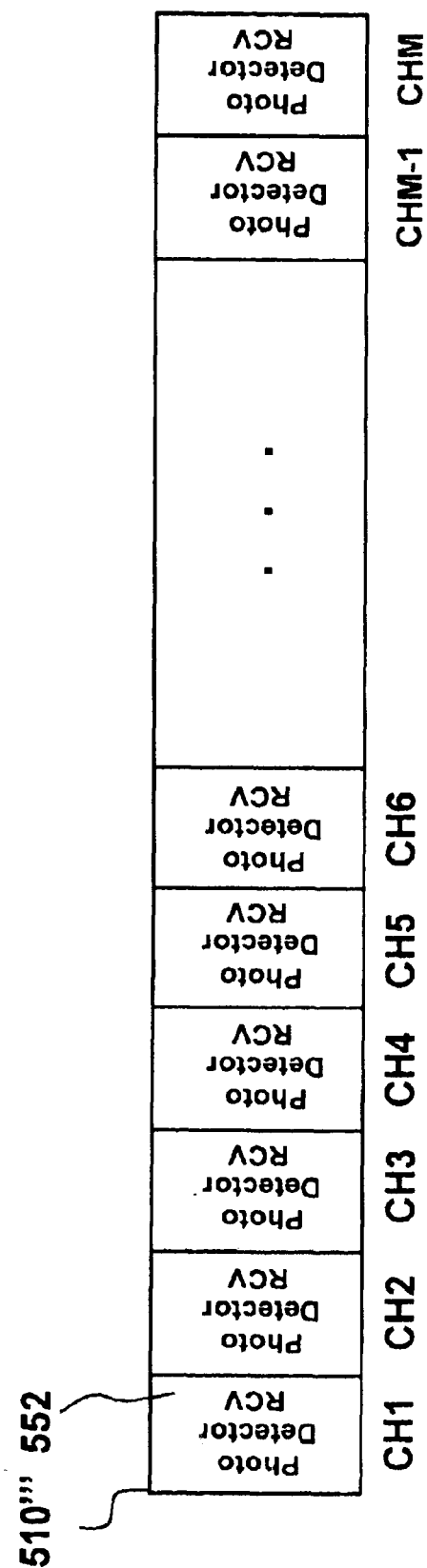
FIG. 5E is a block diagram of a single fiber optic transceiver module to provide M receive channels.

Referring now to FIG. 5A, a system 500 employs six typical fiber optic modules 502A–502F to have six full duplex communication channels. In order to reduce the form factor, the mechanical connectivity and electrical connectivity of the invention can allow one fiber optic module 510 to be utilized in a system 500' such as illustrated in FIG. 5B. The fiber optic module 510 includes an embodiment of the elastomer to provide six full duplex communication channel in a smaller package in order to lower system costs in using fiber optic modules. Other multiples of duplex and simplex communication channels may be provided in a single fiber optic module utilizing an embodiment of the elastomer connection. Referring now to FIG. 5C, the fiber optic module 510' includes an embodiment of the elastomer to provide N full duplex communication channels. The fiber optic module 510' further includes a laser diode transmitter 550 and a photo detector receiver 552 for each of the N full duplex communication channels. Referring now to FIG. 5D, the fiber optic module 510" includes an embodiment of the elastomer to provide M transmitter channels. The fiber optic module 510" further includes a laser diode transmitter 550 for each of the M transmitter channels. Referring now to FIG. 5E, the fiber optic module 510'" includes an embodiment of the elastomer to provide M receiver channels. The fiber optic module 510'"further includes a photo detector receiver 552 for each of the M receiver channels. Each of the fiber optic modules includes at least one optical fiber connector to receive one or more plugs for the multiple fiber optic cables of N or M channels.

Referring now to FIG. 6, a cage or module receptacle 600 is illustrated adjacent to a faceplate or bezel 650. The cage 600 is an integrated cage in that it is a one-piece design. The cage 600 includes a top shield 601, a pair of sides 602A and 602B, and a front opening 604. The cage 600 requires no door at the opening 604 because of the integrated shield 601. An electrical connector 630 at the rear of the cage 600 is provided to receive an electrical connector or an edge connection of a fiber optical module that maybe inserted therein.

The face or bezel 650 includes an opening 652 through which a fiber optic module maybe inserted. The opening 652 is aligned with the opening 604 in the cage 600. In one embodiment a gap exists between the faceplate 650 and cage 600. In another embodiment, a front portion 606 of the cage 600 is inserted into the opening 652 of the faceplate 650.

In each of the sides 602A and 602B of the cage 600 are a pair of guides 620A and 620B. In one embodiment, the pair of guides 620A and 620B are a pair of guide rails. In another embodiment, the pair of guides 620A and 620B are a pair of guide slots. In yet another embodiment, one guide is a guide slot while the other guide is a guide rail. A guide slot is a depression in the side while a guide rail is a protrusion from the side. In the case of guide slots, the guide slots of the cage interface with a guide tab on each side of a fiber optic module. In the case of guide rails, the guide rails of the cage interface with guide slots on each side of a fiber optic module. In one embodiment, the guides 620A and 620B are the guide slots 120A with the cage stop 122 which was previously described.

The top shield 601 of the cage 600 is an integral part of the cage. The top shield 601 may include holes 607 of sufficient size to allow heat to dissipate from an inserted fiber optic module while keeping electromagnetic radiation from leaking out. The cage 600 may provide shielding and in which case its components are formed of a metal or a metalized plastic.

Each side 602A and 602B of the cage 600 includes a pair of post 608 which may be soldered onto a host printed circuit board 115 and couple to a ground trace. In this case, electromagnetic radiation received by the cage may be shunted to ground of the host printed circuit board.

Referring now to FIGS. 7A–7C an alternate cage 700 is illustrated. Cage 700 may similarly be combined with a faceplate or bezel 650 and an electrical connector 630 as illustrated in FIG. 6. The cage 700 may be an open cage with a top opening 701. A top shield such as shield 601 is not needed in this case, although it may be provided, because a pair of flap 705A and 705B are provided at the front opening 704 of the cage 700.

The cage 700 includes a pair of sides 702A and 702B each respectively having a guides 720A and 720B, respectfully. In one embodiment, the pair of guides 720A and 720B are a pair of guide rails. In another embodiment, the pair of guides 720A and 720B are a pair of guide slots. In yet another embodiment, one guide is a guide slot while the other guide is a guide rail. In one embodiment, the guides 720A and 720B are the guide slots 120A with the cage stop 122 which was previously described.

Each side 702A and 702B of the cage 700 includes a pair of post 608 which may be soldiered onto a host printed circuit board and couple to a ground trace. In this case, electromagnetic radiation received by the cage may be shunted to ground of the host printed circuit board.

Referring now to FIG. 7B, a cutaway side view of the front portion of the cage 700 is illustrated. Each flap 705A and 705B includes a spring 710A and 710B, and pin 712A and 712B. The flaps rotate around the pivot pins 712A and 712B. The springs 710A and 710B force the flaps to be in a closed position when a fiber optic module is not inserted. When a fiber optic module is inserted it pushes the flaps away such that it may be inserted into the cage 700. A pair of stops not illustrated keep the flaps from springing further outward.

Referring now to FIG. 7C, a front view of the cage 700 is illustrated. The cage 700 includes the front top flap 705A and the front bottom flap 705B in order to close the opening 704 and deter electromagnetic radiation from leaking out there from. Each end of the pins 712A and 712B couple to sides of the cage 700. Each of the flaps includes a hinge mechanism to rotatably couple to the pivot pins 712A and 712B such that them may be rotatably moveable.

The preferred embodiments of the invention are thus described. While the invention has been described in particular embodiments, the invention should not be construed as limited by such embodiments, but rather construed according to the claims that follow below.

What is claimed is:

1. A fiber optic module comprising:
   one or more optoelectronic devices to convert electrical signals into optical signals or to convert optical signals into electrical signals or both;
   a first guide slot to receive a first guide tab of a receptacle and to guide the fiber optic module into the receptacle;
   a first stop slot integral with the first guide slot, the first stop slot to receive the first guide tab and to stop further insertion of the fiber optic module into the receptacle;
   one or more contact pads to electrically couple to the one or more optoelectronic devices; and
   an elastomer including spaced apart conductors, the elastomer to compress and to electrically couple between the one or more contact pads of the fiber optic module and one or more contact pads of a host printed circuit board.

2. The fiber optic module of claim 1 wherein the first guide tab is engaged with the first stop slot by a force of a spring in the receptacle.

3. The fiber optic module of claim 1, wherein the elastomer is compressed and the first guide tab is engaged with the first stop slot by a force of a spring in the receptacle.

4. The fiber optic module of claim 1, wherein the spaced apart conductors are conductive columns.

5. The fiber optic module of claim 1, wherein the spaced apart conductors are metal columns.

6. The fiber optic module of claim 1, wherein the spaced apart conductors are micro-filaments.

7. The fiber optic module of claim 1, wherein the spaced apart conductors are conductive particles.

8. The fiber optic module of claim 1 further comprising:
   a compression stop to prevent over-compression of the elastomer.

9. The fiber optic module of claim 1 wherein the first guide slot and first stop slot are in first side of the fiber optic module,
   and the fiber optic module further comprises:
   a second guide slot to receive a second guide tab of the receptacle and to guide the fiber optic module into the receptacle;
   a second stop slot integral with the second guide slot, the second stop slot to receive the second guide tab and to stop further insertion of the fiber optic module into the receptacle; and,
   wherein the second guide slot and the second stop slot are in a second side of the fiber optic module opposite the first side.

10. A fiber optic module comprising:
    one or more optoelectronic devices to convert electrical signals into optical signals or to convert optical signals into electrical signals or both;
    a housing to house the one or more optoelectronic devices, the housing including a first guide tab and a second guide tab;
    the first guide tab to engage a first slot of a receptacle and to guide the fiber optic module into the receptacle;
    the second guide tab to engage a second slot of the receptacle and to guide the fiber optic module into the receptacle;
    one or more contact pads to electrically couple to the one or more optoelectronic devices; and an elastomer including spaced apart conductors, the elastomer to compress and to electrically couple between the one or more contact pads of the fiber optic module and one or more contact pads of a host printed circuit board wherein the first guide tab to further engage a first stop slot in the receptacle by a force of a spring in the receptacle.

11. The fiber optic module of claim 10, wherein the first stop slot to stop further insertion of the fiber optic module into the receptacle.

12. The fiber optic module of claim 10, wherein the first stop slot to allow compression of the elastomer and electrical coupling between the one or more contact pads of the fiber optic module and the one or more contact pads of the host printed circuit board.

13. The fiber optic module of claim 10, further comprising:

a power pin extending beyond the one or more contact pads; and a ground pin extending beyond the power pin and the one or more contact pads, the power pin and ground pin to couple to a power socket and a ground socket to provide sequencing of electrical connections for hot pluggability.

14. A method of engaging a fiber optic module into a host system, the method comprising:

engaging a pair of guide tabs of the fiber optic module with a pair of guide rails;

sliding the guide tabs along the guide rails;

moving the guide rails and the fiber optic module closer to a plane of a host printed circuit board; and compressing an elastomer between module contacts of the fiber optic module and host contacts of the host printed circuit board.

15. The method of claim 14 wherein the moving of the guide rails is by a lever.

16. The method of claim 14 wherein the moving of the guide rails is by a spring.

17. A system comprising:

a fiber optic module to engage a module receptacle, the fiber optic module including an optical connector, one or more optoelectronic devices to convert between optical signals and electrical signals, a housing to cover the one or more optoelectronic devices, and a guide tab coupled to the side of the housing; and the module receptacle including a cage to couple to a host printed circuit board, a guide rail to receive the guide tab of the fiber optic module, and a spring coupled to a top of the cage, the spring to apply a force to a top of the housing of the fiber optic module wherein the fiber optic module further includes one or more module contacts, and an elastomer;

wherein the module receptacle further includes an electrical connector having one or more host contacts;

wherein the spring applies sufficient force to the top of the housing of the fiber optic module to compress the elastomer and form electrical connections between the one or more module contacts and the one or more host contacts;

wherein the fiber optic module further includes a ground contact and a power contact extending beyond the one or more module contacts; and wherein the module receptacle further includes a ground contact and a power contact to make an electrical connection with the ground contact and power contact of the fiber optic module prior to the one or more module contacts making electrical connections with the one or more host contacts;

wherein the one or more module contacts and the one or more host contacts are pads, wherein the ground contact and the power contact of the module receptacle are sockets, and wherein the ground contact and power contact of the fiber optic module are pins.

* * * * *